(12) United States Patent
Garcia Redondo et al.

(10) Patent No.: US 11,886,972 B2
(45) Date of Patent: Jan. 30, 2024

(54) NON-VOLATILE MEMORY ACCELERATOR FOR ARTIFICIAL NEURAL NETWORKS

(71) Applicant: Arm Limited, Cambridge (GB)

(72) Inventors: Fernando Garcia Redondo, Cambridge (GB); Shidhartha Das, Upper Cambourne (GB); Paul Nicholas Whatmough, Cambridge, MA (US); Glen Arnold Rosendale, Palo Alto, CA (US)

(73) Assignee: Arm Limited, Cambridge (GB)

( * ) Notice: Subject to any disclaimer, the term of this patent is extended or adjusted under 35 U.S.C. 154(b) by 793 days.

(21) Appl. No.: 17/036,490

(22) Filed: Sep. 29, 2020

(65) Prior Publication Data

US 2022/0101085 A1 Mar. 31, 2022

(51) Int. Cl.
*G06N 3/04* (2023.01)
*G11C 13/00* (2006.01)
(Continued)

(52) U.S. Cl.
CPC ............ *G06N 3/04* (2013.01); *G06F 7/5443* (2013.01); *G06N 3/045* (2023.01); *G06N 3/048* (2023.01); *G06N 3/065* (2023.01); *G11C 11/54* (2013.01); *G11C 13/0007* (2013.01); *G11C 13/0069* (2013.01); *G06N 3/044* (2023.01); *H03M 1/12* (2013.01); *H03M 1/66* (2013.01)

(58) Field of Classification Search
CPC .......... G06N 3/04; G06N 3/045; G06N 3/044; G06N 3/048; G06N 3/065; G06F 7/5443; G06F 2207/4802; G11C 13/0069; G11C 11/54; G11C 13/0007; H03M 1/12; H03M 1/66
See application file for complete search history.

(56) References Cited

U.S. PATENT DOCUMENTS 10,496,374 B2 * 12/2019 Hu .................. G11C 7/1006
2020/0312406 A1 * 10/2020 Sharma ............. G11C 11/54

OTHER PUBLICATIONS

Garcia-Redondo et al., "Training DNN IoT Applications for Deployment On Analog NVM Crossbars," arXiv:1910.13850v3, May 11, 2020.

(Continued)

*Primary Examiner* — Khai M Nguyen
(74) *Attorney, Agent, or Firm* — Leveque Intellectual Property Law, P.C.

(57) ABSTRACT

A non-volatile memory (NVM) crossbar for an artificial neural network (ANN) accelerator is provided. The NVM crossbar includes row signal lines configured to receive input analog voltage signals, multiply-and-accumulate (MAC) column signal lines, a correction column signal line, a MAC cell disposed at each row signal line and MAC column signal line intersection, and a correction cell disposed at each row signal line and correction column signal line intersection. Each MAC cell includes one or more programmable NVM elements programmed to an ANN unipolar weight, and each correction cell includes one or more programmable NVM elements. Each MAC column signal line generates a MAC signal based on the input analog voltage signals and the respective MAC cells, and the correction column signal line generates a correction signal based on the input analog voltage signals and the correction cells. Each MAC signal is corrected based on the correction signal.

20 Claims, 13 Drawing Sheets

(51) Int. Cl.
  *G06F 7/544* (2006.01)
  *H03M 1/12* (2006.01)
  *H03M 1/66* (2006.01)
  *G06N 3/065* (2023.01)
  *G06N 3/045* (2023.01)
  *G06N 3/048* (2023.01)
  *G11C 11/54* (2006.01)
  *G06N 3/044* (2023.01)

(56) References Cited

OTHER PUBLICATIONS

Hu et al., "Dot-Product Engine for Neuromorphic Computing: Programming 1T1M Crossbar to Accelerate Matrix-Vecto Multiplication," Hewlett Packard Labs, HPE-2016-23, Mar. 3, 2016.

* cited by examiner

NON-VOLATILE MEMORY ACCELERATOR FOR ARTIFICIAL NEURAL NETWORKS

BACKGROUND

The present disclosure relates to computer systems. More particularly, the present disclosure relates to computer systems including artificial neural networks (ANNs).

ANNs, such as deep neural networks (DNNs), convolutional neural networks (CNNs), etc., are a popular solution to a wide array of challenging classification, recognition and regression problems. However, many ANNs require a large number of calculations involving a large number of filter weights and activations, which presents a significant challenge with respect to access, storage and performance, particularly for mobile and other power or storage-constrained devices. An ANN hardware accelerator accelerates these calculations, such as, for example, general matrix multiplication (GEMM) operations performed by DNNs, convolution operations performed by CNNs, etc.

CNNs typically do not perform native convolution operations due to the complicated dataflow and expensive datapaths that are required. Instead, native convolution operations are converted into GEMM operations, which are then executed more efficiently by a central processing unit (CPU), a specialized processor, a hardware accelerator such as a non-volatile memory (NVM) accelerator, etc., using optimized software libraries, specialized digital and analog hardware, etc. For example, the filter weights and activations (i.e., input feature maps or IFMs) for a convolution layer of a CNN may be converted into an expanded format (e.g., IM2COL format), and then processed as GEMM operations by an ANN hardware accelerator to generate output feature maps (OFMs). An activation or scaling function and a bias may be applied to the OFMs by the convolution layer or a separate activation layer, and then the OFMs are provided as the activations (i.e., IFMs) for the next layer of the CNN.

An NVM accelerator includes both digital processing circuitry and one or more analog NVM crossbars that perform GEMM operations, such as matrix multiply-accumulate (MAC) operations. Unfortunately, NVM accelerators with analog NVM crossbars can generate undesirable noise that significantly reduces the accuracy of the ANN.

DETAILED DESCRIPTION

Figure 1:
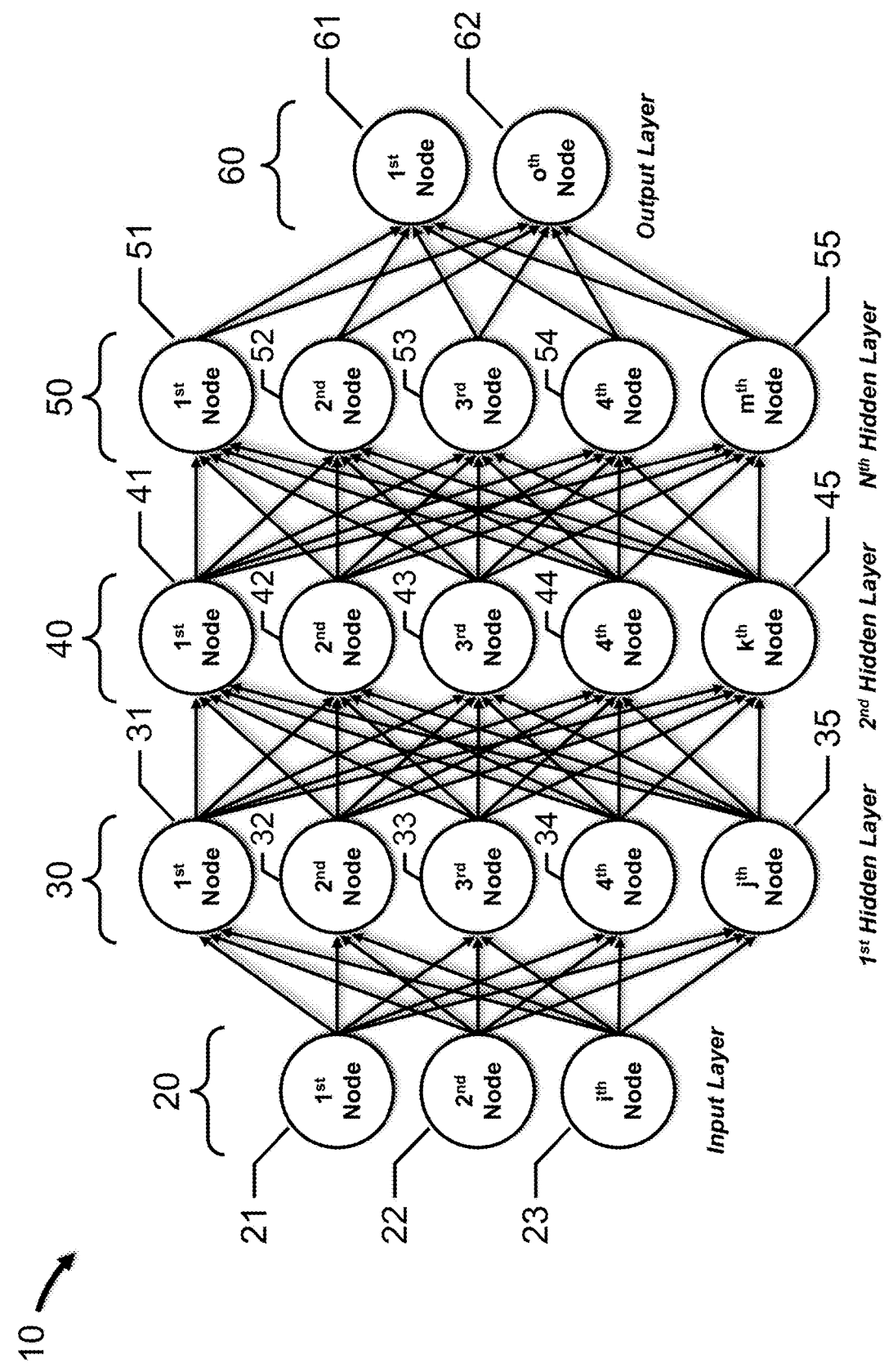
FIG. 1 depicts an ANN, in accordance with an embodiment of the present disclosure.

Embodiments of the present disclosure will now be described with reference to the drawing figures, in which like reference numerals refer to like parts throughout.

Embodiments of the present disclosure advantageously provide an NVM crossbar with unipolar weights that significantly reduces the spurious noise contributions caused by undesirable currents that are generated by NVM cells that are programmed to a conductance value of $g_{off}$.

In one embodiment, a non-volatile memory (NVM) crossbar is provided that includes a plurality of row signal lines configured to receive input analog voltage signals; a plurality of multiply-and-accumulate (MAC) column signal lines; a correction column signal line; a MAC cell disposed at each intersection of a row signal line and a MAC column signal line; and a correction cell disposed at each intersection of a row signal line and the correction column signal line. Each MAC cell includes one or more NVM elements programmed to a conductance level representing one of a plurality of unipolar weights of an ANN, and each correction cell includes one or more NVM elements programmed to a predetermined conductance level. Each MAC column signal line is configured to generate a MAC signal based on the input analog voltage signals and the respective MAC cells, and the correction column signal line is configured to generate a correction signal based on the input analog voltage signals and the correction cells. Each MAC signal is corrected based on the correction signal.

An ANN models the relationships between input data or signals and output data or signals using a network of interconnected nodes that is trained through a learning process. The nodes are arranged into various layers, including, for example, an input layer, one or more hidden layers, and an output layer. The input layer receives input data, such as, for example, image data, and the output layer generates output data, such as, for example, a probability that the image data contains a known object. Each hidden layer provides at least a partial transformation of the input data to the output data. A DNN has multiple hidden layers in order to model complex, nonlinear relationships between input data and output data.

In a fully-connected, feedforward ANN, each node is connected to all of the nodes in the preceding layer, as well as to all of the nodes in the subsequent layer. For example, each input layer node is connected to each hidden layer node, each hidden layer node is connected to each input layer node and each output layer node, and each output layer node is connected to each hidden layer node. Additional hidden layers are similarly interconnected. Each connection has a weight value, and each node has an activation function, such as, for example, a linear function, a step function, a sigmoid function, a tanh function, a rectified linear unit (ReLU) function, etc., that determines the output of the node based on the weighted sum of the inputs to the node. The input data propagates from the input layer nodes, through respective connection weights to the hidden layer nodes, and then through respective connection weights to the output layer nodes.

More particularly, at each input node, input data is provided to the activation function for that node, and the output of the activation function is then provided as an input data value to each hidden layer node. At each hidden layer node, the input data value received from each input layer node is multiplied by a respective connection weight, and the resulting products are summed or accumulated into an activation value that is provided to the activation function for that node. The output of the activation function is then provided as an input data value to each output layer node. At each output layer node, the output data value received from each hidden layer node is multiplied by a respective connection weight, and the resulting products are summed or accumulated into an activation value that is provided to the activation function for that node. The output of the activation function is then provided as output data. Additional hidden layers may be similarly configured to process data.

FIG. 1 depicts ANN 10, in accordance with an embodiment of the present disclosure.

ANN 10 includes input layer 20, one or more hidden layers 30, 40, 50, etc., and output layer 60. Input layer 20 includes one or more input nodes 21, 22, 23, etc. Hidden layer 30 includes one or more hidden nodes 31, 32, 33, 34, 35, etc. Hidden layer 40 includes one or more hidden nodes 41, 42, 43, 44, 45, etc. Hidden layer 50 includes one or more hidden nodes 51, 52, 53, 54, 55, etc. Output layer 60 includes one or more output nodes 61, 62, etc. Generally, ANN 10 includes N hidden layers, input layer 20 includes "i" nodes, hidden layer 30 includes "j" nodes, hidden layer 40 includes "k" nodes, hidden layer 50 includes "m" nodes, and output layer 60 includes "o" nodes.

In one embodiment, N equals 3, i equals 3, j, k and m equal 5 and o equals 2 (depicted in FIG. 1). Input node 21 is coupled to hidden nodes 31 to 35, input node 22 is coupled to hidden nodes 31 to 35, and input node 23 is coupled to hidden nodes 31 to 35. Hidden node 31 is coupled to hidden nodes 41 to 45, hidden node 32 is coupled to hidden nodes 41 to 45, hidden node 33 is coupled to hidden nodes 41 to 45, hidden node 34 is coupled to hidden nodes 41 to 45, and hidden node 35 is coupled to hidden nodes 41 to 45. Hidden node 41 is coupled to hidden nodes 51 to 55, hidden node 42 is coupled to hidden nodes 51 to 55, hidden node 43 is coupled to hidden nodes 51 to 55, hidden node 44 is coupled to hidden nodes 51 to 55, and hidden node 45 is coupled to hidden nodes 51 to 55. Hidden node 51 is coupled to output nodes 61 and 62, hidden node 52 is coupled to output nodes 61 and 62, hidden node 53 is coupled to output nodes 61 and 62, hidden node 54 is coupled to output nodes 61 and 62, and hidden node 55 is coupled to output nodes 61 and 62.

Many other variations of input, hidden and output layers are clearly possible, including hidden layers that are locally-connected, rather than fully-connected, to one another.

Training an ANN includes optimizing the connection weights between nodes by minimizing the prediction error of the output data until the ANN achieves a particular level of accuracy. One method is backpropagation, or backward propagation of errors, which iteratively and recursively determines a gradient descent with respect to the connection weights, and then adjusts the connection weights to improve the performance of the network.

A multi-layer perceptron (MLP) is a fully-connected ANN that has an input layer, an output layer and one or more hidden layers. MLPs may be used for natural language processing applications, such as machine translation, speech recognition, etc. Other ANNs include recurrent neural networks (RNNs), long short-term memories (LSTMs), sequence-to-sequence models that include an encoder RNN and a decoder RNN, shallow neural networks, etc.

A CNN is a variation of an MLP that may be used for classification or recognition applications, such as image recognition, speech recognition, etc. A CNN has an input layer, an output layer and multiple hidden layers including convolutional layers, pooling layers, normalization layers, fully-connected layers, etc. Each convolutional layer applies a sliding dot product or cross-correlation to an input volume, applies an activation function to the results, and then provides the activation or output volume to the next layer. Convolutional layers typically use the ReLU function as the activation function. In certain embodiments, the activation function is provided in a separate activation layer, such as, for example, a ReLU layer. A pooling layer reduces the dimensions of the output volume received from the preceding convolutional layer, and may calculate an average or a maximum over small clusters of data, such as, for example, 2×2 matrices. In certain embodiments, a convolutional layer and a pooling layer may form a single layer of a CNN. The fully-connected layers follow the convolutional and pooling layers, and include a flatten layer and a classification layer, followed by a normalization layer that includes a normalization function, such as the SoftMax function. The output layer follows the last fully-connected layer; in certain embodiments, the output layer may include the normalization function.

Figure 2A:
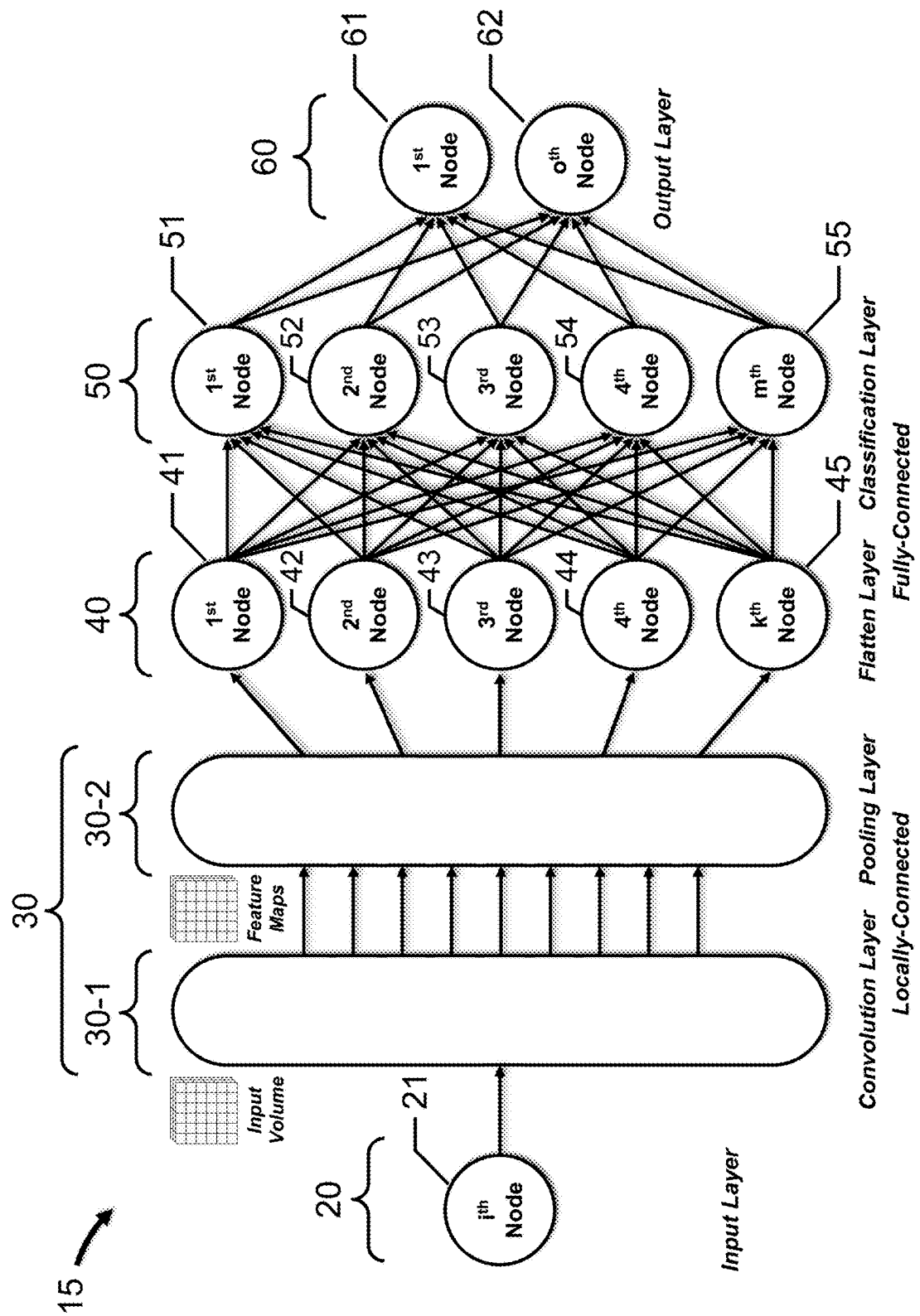
FIG. 2A depicts a CNN, in accordance with an embodiment of the present disclosure.

FIG. 2A depicts CNN 15, in accordance with an embodiment of the present disclosure. CNN 15 includes input layer 20, one or more hidden layers, such as convolutional layer 30-1, pooling layer 30-2, hidden (flatten) layer 40, hidden (classification) layer 50, etc., and output layer 60. Many other variations of input, hidden and output layers are contemplated.

Input layer 20 includes one or more input nodes 21, etc., that present the input data, such as a color image, as an input volume to the first convolutional layer, e.g., convolutional layer 30-1. The input volume is a three-dimensional matrix that has a width, a height and a depth. For example, input data that represent a color image may be presented as an input volume that is 512 pixels×512 pixels×3 channels (red, green, blue); other input volume dimensions may also be used, such as 32×32×3, 64×64×3, 128×128×3, etc., 32×32×1, 64×64×1, 128×128×1, 512×512×1, etc.

Convolutional layer 30-1 is locally-connected to input layer 20, and includes a plurality of nodes that are connected to local regions in the input volume (not depicted for clarity). For a CNN that uses a standard convolution, each node computes a dot product between the node's weights and the respective local region of the input volume to generate one element of an output volume. An activation function and a bias may be applied to each element of the output volume, and the output volume is then provided as the input volume to the next layer. The activation function and bias may be applied by each convolutional layer node or by the nodes of a subsequent locally-connected layer, such as an ReLU layer.

Pooling layer 30-2 is locally-connected to convolutional layer 30-1, and includes a plurality of nodes that are connected to local regions in the input volume (not depicted for clarity). Pooling layer 30-2 also produces an output volume that is provided as the input volume to the subsequent layer, such as, for example, another convolutional layer 30-1, a flatten layer 40, etc. In certain embodiments, convolutional layer 30-1 and pooling layer 30-2 form a single hidden layer 30. Similarly, in certain embodiments, convolutional layer 30-1, a ReLU layer and pooling layer 30-2 form a single hidden layer 30. Generally, the output volumes of the convolutional and pooling layers may be described as output feature maps, and one or more single hidden layers 30 form a feature learning portion of CNN 15.

Hidden layer 40 is a "flatten" layer that is locally-connected to pooling layer 30-2, and includes one or more hidden (flatten) nodes 41, 42, 43, 44, 45, etc. Hidden (flatten) layer 40 "flattens" the output volume produced by the preceding pooling layer 30-2 into a column vector, which is provided to the subsequent, fully-connected hidden layer 50.

Hidden layer 50 is a classification layer that is fully-connected to hidden (flatten) layer 40, and includes one or more hidden (classification) nodes 51, 52, 53, 54, 55, etc.

Output layer 60 includes one or more output nodes 61, 62, etc., and is fully-connected to hidden (classification) layer 50. Fully-connected output layer 60 receives the classification results output by hidden (classification) layer 50, and each node outputs a predicted class score. A normalization function, such as a Softmax function, may be applied to the predicted class scores by output layer 60, or, alternatively, by an additional layer interposed between hidden (classification) layer 50 and output layer 60.

Similar to ANNs, training a CNN includes optimizing the connection weights between nodes by minimizing the prediction error of the output data until the CNN achieves a particular level of accuracy. As noted above, backpropagation may be used to iteratively and recursively determines a gradient descent with respect to the connection weights, and then adjusts the connection weights to improve the performance of the network. Matrix multiplication operations, and, more particularly, multiply-and-accumulate (MAC) operations, are used extensively by CNNs, as well as other ANNs.

Figure 2B:
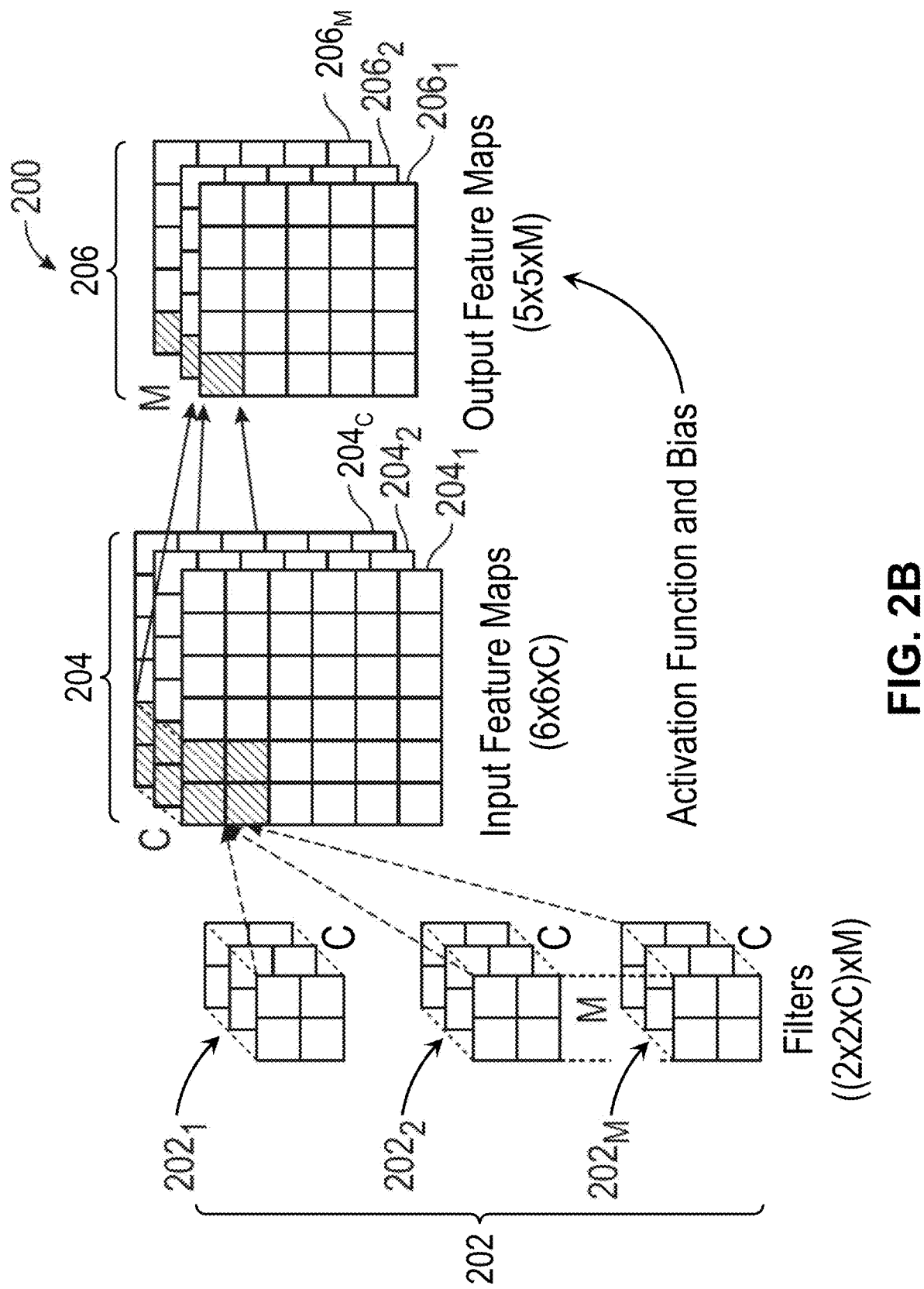
FIG. 2B depicts a convolution operation within a convolutional layer of a CNN, in accordance with an embodiment of the present disclosure.

FIG. 2B depicts convolution layer operation 200 within convolutional layer 30-1 of CNN 15, in accordance with an embodiment of the present disclosure.

In this embodiment, convolutional layer 30-1 generally includes M filters 202, C input channels, C input feature maps 204 (i.e., one input feature map for each input channel) and M output feature maps 206 (i.e., one output feature map for each filter). Each filter 202 has C weight sets (i.e., each filter has a weight set for each input channel), and is convolved across the input feature maps to produce an output feature map corresponding to that filter. Convolutional layers generally require the movement of large amounts of data, generate a significant computational load, and require buffers of considerable size to store intermediate values.

More particularly, convolutional layer 30-1 includes filters $202_1$, $202_2$, . . . , $202_M$, input feature maps $204_1$, $204_2$, . . . , $204_C$, and output feature maps $206_1$, $206_2$, . . . , $206_M$. For illustration purposes, each of the C weight sets within each filter $202_1$, $202_2$, . . . , $202_M$ is a 2×2 weight matrix, each input feature map $204_1$, $204_2$, . . . , $204_C$ is a 6×6 input data matrix, and each output feature map $206_1$, $206_2$, . . . , $206_M$ is a 5×5 output data matrix. In this embodiment, with a stride of 1 and no padding, the total number of MAC operations performed by convolutional layer operation 200 is 2×2×C×5×5×M.

An activation function and a bias may be applied to each element of output feature maps 206, which are then provided as the input feature maps 204 to the next layer. An activation function and bias may be applied after each element of output feature maps 206 is calculated, after all of the elements of output feature maps 206 are calculated, or by a subsequent locally-connected layer, such as an ReLU layer.

Figure 2C:
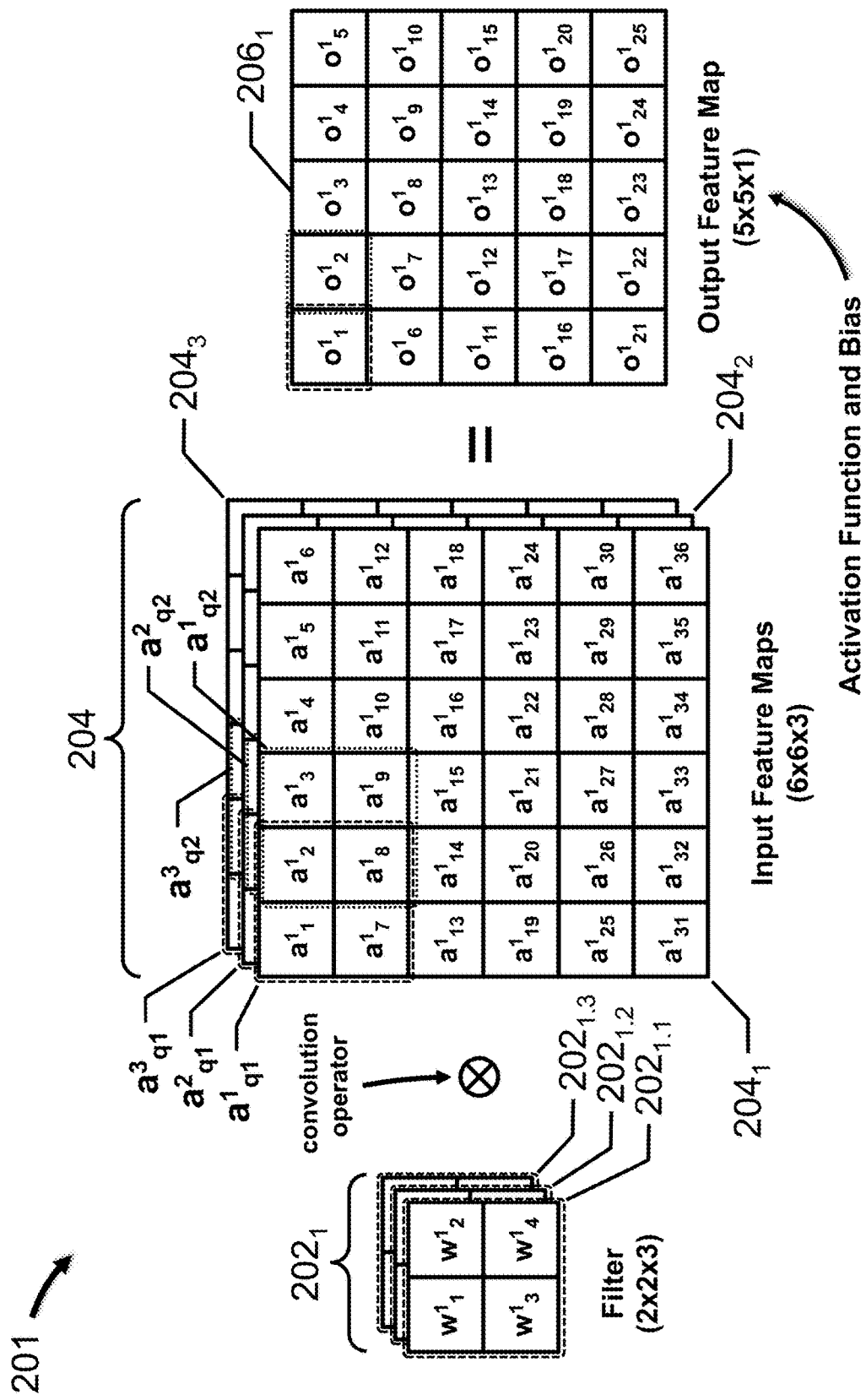
FIG. 2C depicts another convolutional layer operation for a CNN, in accordance with an embodiment of the present disclosure.

FIG. 2C depicts another convolutional layer operation 201 within convolutional layer 30-1 of CNN 15, in accordance with an embodiment of the present disclosure. Convolution layer operation 201 is a simplified version of convolution layer operation 200 that includes 3 input channels and a single filter $202_1$, i.e., C equals 3 and M equals 1.

Convolutional layer 30-1 includes filter $202_1$, input feature maps $204_1$, $204_2$, $204_3$, and output feature map $206_1$. For illustration purposes, each of the 3 weight sets within filter $202_1$ is a 2×2 weight matrix, each input feature map $204_1$, $204_2$, $204_3$ is a 6×6 input data matrix, and output feature map $206_1$ is a 5×5 output data matrix. Filter $202_1$ (2×2×3) includes weight matrix $202_{1.1}$ ($w^1$), weight matrix $202_{1.2}$ ($w^2$), and weight matrix $202_{1.3}$ ($w^3$). Filter $202_1$ is convolved with input feature maps $204_1$, $204_2$, $204_3$ to produce output feature map $206_1$. In this embodiment, with a stride of 1 and no padding, the total number of MAC operations performed by convolution layer operation 200 is 2×2×3×5×5×1 or 300.

Output feature map element $o^1_1$ is the sum of the dot product of filter $202_{1.1}$ ($w^1$) and the upper left quadrant of input feature map $204_1$ ($a^1_{q1}$), the dot product of filter $202_{1.2}$ ($w^2$) and the upper left quadrant of input feature map $204_2$ ($a^2_{q1}$), and the dot product of filter $202_{1.3}$ ($w^3$) and the upper left quadrant of input feature map $204_3$ ($a^3_{q1}$).

More particularly, the dot product of filter $202_{1.1}$ ($w^1$) and the upper left quadrant of input feature map $204_1$ ($a^1_{q1}$) is equal to $w^1_1 \cdot a^1_1 + w^1_2 \cdot a^1_2 + w^1_3 \cdot a^1_7 + w^1_4 \cdot a^1_8$. The dot product of filter $202_{1.2}$ ($w^2$) and the upper left quadrant of input feature map $204_2$ ($a^2_{q1}$), and the dot product of filter $202_{1.3}$ ($w^3$) and the upper left quadrant of input feature map $204_3$ ($a^3_{q1}$) are calculated in the same manner, i.e., the dot product of filter $202_{1.2}$ ($w^2$) and the upper left quadrant of input feature map $204_2$ ($a^2_{q1}$) is equal to $w^2_1 \cdot a^2_1 + w^2_2 \cdot a^2_2 + w^2_3 \cdot a^2_7 + w^2_4 \cdot a^2_8$, and the dot product of filter $202_{1.3}$ ($w^3$) and the upper left quadrant of input feature map $204_3$ ($a^3_{q1}$) is equal to $w^3_1 \cdot a^3_1 + w^3_2 \cdot a^3_2 + w^3_3 \cdot a^3_7 + w^3_4 \cdot a^3_8$.

Output feature map element $o^1_2$ is the sum of the dot product of filter $202_{1.1}$ ($w^1$) and the next upper quadrant of input feature map $204_1$, the dot product of filter $202_{1.2}$ ($w^2$) and the next upper quadrant of input feature map $204_2$, and the dot product of filter $202_{1.3}$ ($w^3$) and the next upper quadrant of input feature map $204_3$. The "next" upper quadrant in each input feature map $204_1$, $204_2$ and $204_3$ has been shifted one column to the right relative to the first upper quadrant.

More particularly, the dot product of filter $202_{1.1}$ ($w^1$) and the next upper left quadrant of input feature map $204_1$ ($a^1_{q2}$) is equal to $w^1_1 \cdot a^1_2 + w^1_2 \cdot a^1_3 + w^1_3 \cdot a^1_8 + w^1_4 \cdot a^1_9$. The dot product of filter $202_{1.2}$ ($w^2$) and the next upper left quadrant of input feature map $204_2$ ($a^2_{q2}$), and the dot product of filter $202_{1.3}$ ($w^3$) and the upper left quadrant of input feature map $204_3$ ($a^3_{q2}$) are calculated in the same manner, i.e., the dot product of filter $202_{1.2}$ ($w^2$) and the next upper left quadrant of input feature map $204_2$ ($a^2_{q2}$) is equal to $w^2_1 \cdot a^2_2 + w^2_2 \cdot a^2_3 + w^2_3 \cdot a^2_8 + w^2_4 \cdot a^2_9$, and the dot product of filter $202_{1.3}$ ($w^3$) and the next upper left quadrant of input feature map $204_3$ ($a^3_{q2}$) is equal to $w^3_1 \cdot a^3_2 + w^3_2 \cdot a^3_3 + w^3_3 \cdot a^3_8 + w^3_4 \cdot a^3_9$.

The remaining output feature map elements $o^1_3$ to $o^1_5$ are calculated in a similar manner. After output feature map element $o_5$ has been calculated, the next quadrant in each input feature map $204_1$, $204_2$ and $204_3$ is shifted to the leftmost column and down one row for the calculation of output feature map element $o^1_6$. Output feature map elements $o^1_7$ to $o^1_{10}$ are then calculated by successively shifting the quadrant in each input feature map $204_1$, $204_2$ and $204_3$ one column to the right. The remaining output feature map elements $o^1_{11}$ to $o^1_{15}$, $o^1_{16}$ to $o^1_{20}$, and $o^1_{21}$ to $o^1_{25}$ are calculated in a similar manner.

An activation function and a bias may be applied to each element of output feature map $206_1$, which is then provided as an input feature map $204$ to the next layer. The activation function and bias may be applied after each element of output feature map $206_1$ is calculated, after all of the elements of output feature map $206_1$ are calculated, or by a subsequent locally-connected layer, such as an ReLU layer.

Figure 2D:
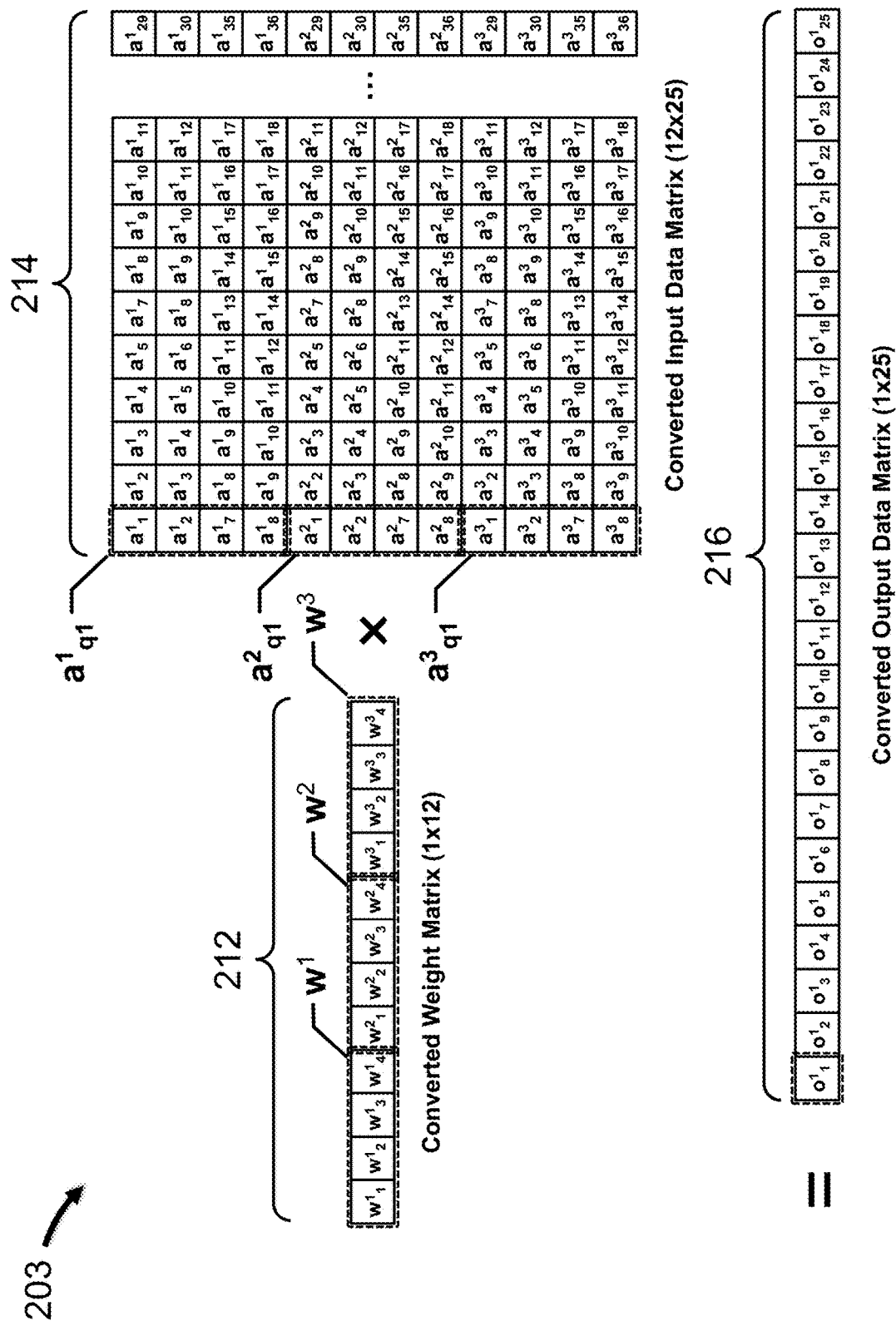
FIG. 2D depicts a converted convolutional layer operation for a CNN, in accordance with an embodiment of the present disclosure.

FIG. 2D depicts a converted convolutional layer operation $203$ within convolutional layer $30$-$1$ of CNN $15$, in accordance with an embodiment of the present disclosure.

Convolution layer operation $201$ may be converted into a simple matrix MAC operation by converting filter $202_1$ into converted weight matrix $212$ ($1\times12$), and converting input feature maps $204_1$, $204_2$, $204_3$ into converted input data matrix $214$ ($12\times25$). Converted weight matrix $212$ and converted input data matrix $214$ are multiplied to generate converted output data matrix $216$ ($1\times25$), which is reformed into output feature map $206_1$ ($5\times5$). For ease of illustration, converted input data matrix $214$ is depicted in abbreviated form.

In this example, converted output data matrix element $o^1_1$ is the sum of the dot products of the first (i.e., only) row of converted weight matrix $212$ and the first column of converted input data matrix $214$. The converted weight matrix $212$ includes filter $202_{1.1}$ ($w^1$), filter $202_{1.2}$ ($w^2$), and filter $202_{1.3}$ ($w^3$), while the first row of converted input data matrix $214$ includes the elements of the upper left quadrant of input feature map $204_1$ ($a^1_{q1}$), the upper left quadrant of input feature map $204_2$ ($a^2_{q1}$), and the upper left quadrant of input feature map $204_3$ ($a^3_{q1}$). More particularly, the converted output data matrix element $o_1$ is equal to $w^1_1 \cdot a^1_1 + w^1_2 \cdot a^1_2 + w^1_3 \cdot a^1_7 + w^1_4 \cdot a^1_8 + w^2_1 \cdot a^2_1 + w^2_2 \cdot a^2_2 + w^2_3 \cdot a^2_7 + w^2_4 \cdot a^1_8 + w^3_1 \cdot a^3_1 + w^3_2 \cdot a^3_2 + w^3_3 \cdot a^3_7 + w^3_4 \cdot a^1_8$. As discussed above, the converted output data matrix element $o^1_1$ is equal to the output feature map element $o^1_1$.

Similarly, converted output data matrix element $o^1_2$ is the sum of the dot products of the first row of converted weight matrix $212$ and the second column of converted input data matrix $214$, converted output data matrix element $o^1_3$ is the sum of the dot products of the first row of converted weight matrix $212$ and the third column of converted input data matrix $214$, and so on.

Figure 3A:
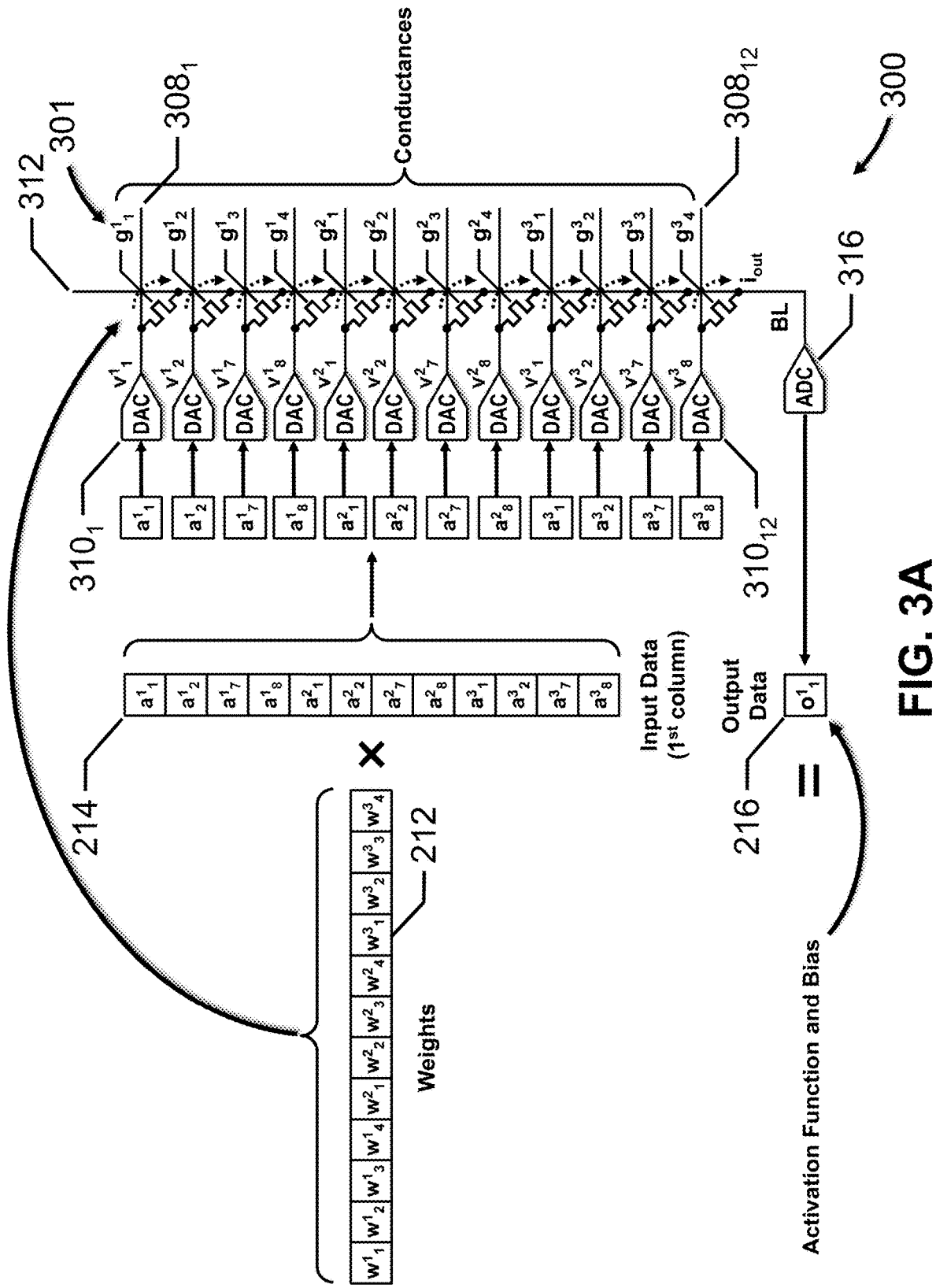
FIG. 3A depicts a portion of the converted convolutional layer operation of FIG. 2D implemented using an NVM crossbar.

FIG. 3A depicts a portion of convolutional layer operation $203$ of FIG. 2D implemented using NVM crossbar module $300$, in accordance with an embodiment of the present disclosure.

NVM accelerators include both digital processing circuitry and one or more analog NVM crossbar modules that perform matrix MAC operations. Generally, an NVM crossbar module includes digital-to-analog converters (DACs), analog-to-digital converters (ADCs), and an NVM crossbar with an array of NVM cells. Each NVM cell includes one or more programmable NVM elements. This mixed-signal approach relies on Ohm's law to implement matrix MAC operations by taking advantage of the resistive nature of emerging NVM technologies, such as, for example, phase change memory (PCM), resistive random access memory (RRAM), magnetic RAM (MRAM), correlated electron RAM (CeRAM), etc.

More particularly, the application of a voltage across an NVM cell generates a current that is proportional to the product of the conductance of the NVM element(s) within the NVM cell and the voltage across the NVM cell. Currents from multiple NVM cells in the same column of the array combine to generate an accumulated current (i.e., the sum of the products generated by the NVM cells in that column). Thus, a combination of Ohm's law and Kirchoff's current law implements matrix MAC operations in parallel. The NVM element(s) within each NVM cell are programmed to a discrete conductance level that represents a weight value.

In certain embodiments, the weights are stationary, i.e., the weights are programmed into the NVM crossbar once and do not change during the course of ANN inference operations. Typical NVM elements, such as, for example, PCM and RRAM, have a limited write endurance, and it is possible to write to them a limited number of times (e.g., about 100) after which the devices exhibit functional failure. Other NVM elements, such as, for example, MRAM and CeRAM, may exhibit significantly higher endurance (e.g., about 1,000), but continuous operation may lead to a limited lifetime. Hence, such lifetime limits pose significant constraints on NVM accelerator architectures that rely upon updating weights each inference cycle.

Unfortunately, the weights cannot be practically streamed from an external dynamic random access memory (DRAM) and must be fixed on-chip. Further, NVM cells suffer from high write-powers, and consequent expensive power consumption, which may effect the efficient performance of update operations. Thus, the write phase can be problematic and take a long time to complete.

As a consequence, each layer of the ANN may need to be unrolled into an on-chip NVM crossbar and fixed during ANN inference operations. While this option has the advantage of eliminating DRAM power consumption, it may undesirably limit the maximum size of the ANN that can be programmed on-chip. Further, this option also incurs an area penalty as mapping larger ANNs requires instantiation of NVM crossbar modules that are megabits in capacity. This consumes higher area and increases susceptibility to chip-failures due to yield loss. Moreover, instantiating multiple NVM crossbar modules requires instantiation of multiple DACs and ADCs, all of which need to be programmed, trimmed and compensated for drift.

An NVM CeRAM element is a particular type of random access memory formed, wholly or in part, from a correlated electron material. The CeRAM may exhibit an abrupt conductive or insulative state transition arising from electron correlations rather than solid state structural phase changes such as, for example, filamentary formation and conduction in resistive RAM devices. An abrupt conductor/insulator transition in a CeRAM may be responsive to a quantum mechanical phenomenon, in contrast to melting/solidification or filament formation.

A quantum mechanical transition of a CeRAM between an insulative state and a conductive state may be understood in terms of a Mott transition. In a Mott transition, a material may switch from an insulative state to a conductive state if a Mott transition condition occurs. When a critical carrier concentration is achieved such that a Mott criteria is met, the Mott transition will occur and the state will change from high resistance/impedance (or capacitance) to low resistance/impedance (or capacitance).

A state or memory state of the CeRAM element may be dependent on the impedance or conductive state of the CeRAM element. In this context, the state or memory state means a detectable state of a memory device that is indicative of a value, symbol, parameter or condition, just to provide a few examples. In a particular implementation, a memory state of a memory device may be detected based, at least in part, on a signal detected on terminals of the memory device in a read operation. In another implementation, a memory device may be placed in a particular memory state to represent or store a particular value, symbol or parameter by application of one or more signals across terminals of the memory device in a write operation.

An NVM CeRAM element may comprise material sandwiched between conductive terminals. By applying a specific voltage and current between the terminals, the material may transition between the aforementioned conductive and insulative states. The material of a CeRAM element sandwiched between conductive terminals may be placed in an insulative state by application of a first programming signal across the terminals having a reset voltage and reset current at a reset current density, or placed in a conductive state by application of a second programming signal across the terminals having a set voltage and set current at set current density.

NVM crossbar module 300 includes DACs $310_1, \ldots, 310_N$, NVM crossbar 301, and ADCs $320_1, \ldots, 320_M$. NVM crossbar 301 includes twelve row signal lines 308, i.e., row signal lines $308_1, \ldots, 308_{12}$, one column signal line 312 and an NVM cell disposed at each intersection of row signal lines $308_1, \ldots, 308_{12}$ and the column signal line 312. DACs $310_1, \ldots, 310_N$ are coupled to row signal lines $308_1, \ldots, 308_N$, and ADCs $320_1, \ldots, 320_M$ are coupled to column signal lines $312_1, \ldots, 312_M$. Each NVM cell includes one or more NVM elements whose conductance is programmed to be proportional to a particular of weight of filter $202_1$, i.e., $w^1_1, w^1_2$, etc. The conductances are represented by $g^1_1, g^1_2, g^1_3, g^1_4, g^2_2, g^2_3, g^2_4, g^3_2, g^3_3$, and $g^3_4$, which are proportional to weights $w^1_1, w^1_2, w^1_3, w^1_4, w^2_1, w^2_2, w^2_3, w^2_4, w^3_1, w^3_2, w^3_3$, and $w^3_4$, respectively.

The accumulated dot-products of the input data and weights along column signal line 312 may be represented by Equation 1, which represents a simple matrix MAC operation:

$$BL = \Sigma_{i=1 \ldots N}(g_i * v_i) \quad \text{(Eq. 1)}$$

where N equals 12. Each input data value (i.e., voltage $v_i$) is multiplied by the appropriate weight (i.e., conductance $g_i$), and the products are accumulated into a result (i.e., the accumulated current).

In order to calculate the first element of converted output data matrix 216, i.e., $o^1_1$, input data from the first column of converted input data matrix 214 are provided to NVM crossbar module 300 as inputs $a^1_1, a^1_2, a^1_7, a^1_8, a^2_1, a^2_2, a^2_7, a^2_8, a^3_1, a^3_2, a^3_7$ and $a^3_8$ to DACs $310_1, \ldots, 310_{12}$, respectively. DACs $310_1, \ldots, 310_{12}$ then output respective analog voltages $v^1_1, v^1_2, v^1_7, v^1_8, v^2_1, v^2_2, v^2_7, v^2_8, v^3_1, v^3_2, v^3_7$ and $v^3_8$ along row signal lines $308_1, \ldots, 308_{12}$, respectively, to column signal line 312. Column signal line 312 conveys a bit line (BL) signal, whose current is proportional to the accumulated dot-products of the input data and weights along column signal line 312. Signal BL is then digitized using ADC 320 to obtain the first element of converted output data matrix 216, i.e., $o^1_1$.

Similarly, in order to calculate the second element of converted output data matrix 216, i.e., $o^1_2$, input data from the second column of converted input data matrix 214 are provided to NVM crossbar module 300 as inputs $a^1_2, a^1_3, a^1_8, a^1_9, a^2_2, a^2_3, a^2_8, a^2_9, a^3_2, a^3_3, a^3_8$ and $a^3_9$ to DACs $310_1, \ldots, 310_{12}$, respectively. DACs $310_1, \ldots, 310_{12}$ then output respective analog voltages $v^1_2, v^1_3, v^1_8, v^1_9, v^2_2, v^2_3, v^2_8, v^2_9, v^3_2, v^3_3, v^3_8$ and $v^3_9$ along row signal lines $308_1, \ldots, 308_{12}$, respectively, to column signal line 312. Column signal line 312 conveys signal BL, whose current is proportional to the accumulated dot-products of the input data and weights along column signal line 312. Signal BL is then digitized using ADC 320 to obtain the second element of converted output data matrix 216, i.e., $o^1_2$. The remaining elements of converted output data matrix 216 are calculated in the same manner.

An activation function and a bias may be applied to each element of converted output data matrix 216 to generate the elements of output feature map $206_1$, which is then provided as an input feature map 204 to the next layer. The activation function and bias may be applied after each element of converted output data matrix 216 is calculated, after all of the elements of converted output data matrix 216 are calculated, or by a subsequent locally-connected layer, such as an ReLU layer.

Figure 3B:
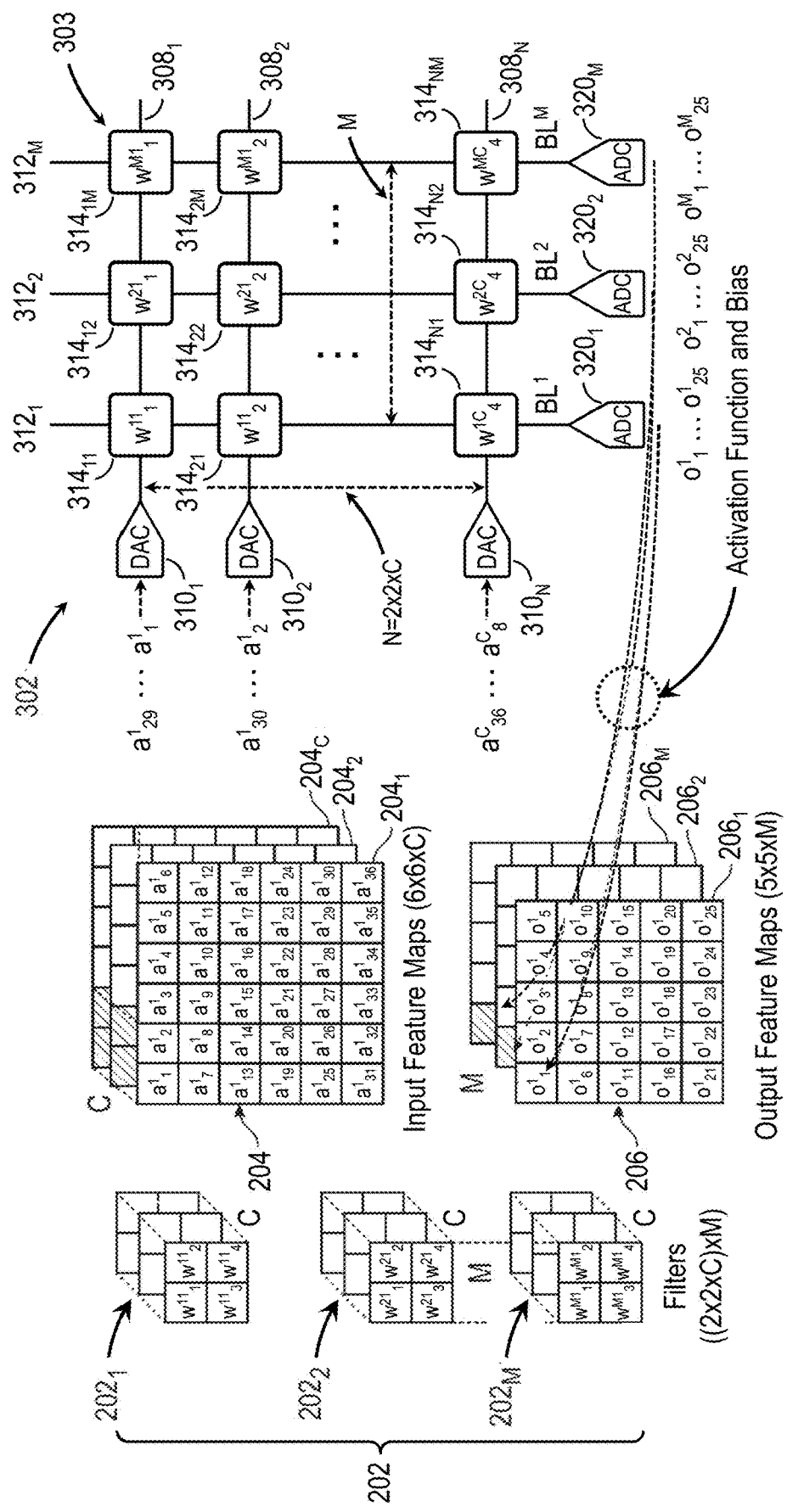
FIG. 3B depicts a portion of the convolutional layer operation of FIG. 2B implemented using an NVM crossbar.

FIG. 3B depicts convolutional layer operation 200 of FIG. 2B implemented using NVM crossbar module 302, in accordance with an embodiment of the present disclosure.

In this depiction of convolutional layer operation 200, certain elements of filters 202, input feature maps 204 and output feature maps 206 have been depicted for illustrative purposes.

Filters 202 include M filters. The first filter $202_1$ includes C weight matrices, each including four weights (2×2). The first weight matrix includes $w^{11}_1, w^{11}_2, w^{11}_3$, and $w^{11}_4$ (depicted), the second weight matrix includes $w^{12}_1, w^{12}_2, w^{12}_3$, and $w^{12}_4$ (not depicted for clarity), and so on. The last weight matrix includes $w^{1C}_1, w^{1C}_2, w^{1C}_3$, and $w^{1C}_4$ (not depicted for clarity). The second filter $202_2$ includes C weight matrices, each including four weights. The first weight matrix includes $w^{21}_1, w^{21}_2, w^{21}_3$, and $w^{21}_4$ (depicted), the second weight matrix includes $w^{22}_1, w^{22}_2, w^{22}_3$, and $w^{22}_4$ (not depicted for clarity), and so on. The last weight matrix includes $w^{2C}_1, w^{2C}_2, w^{2C}_3$, and $w^{2C}_4$ (not depicted for clarity). The last filter $202_M$ includes C weight matrices, each including four weights. The first weight matrix includes $w^{M1}_1, w^{M1}_2, w^{M1}_3$, and $w^{M1}_4$ (depicted), the second weight matrix includes $w^{M2}_1, w^{M2}_2, w^{M2}_3$, and $w^{M2}_4$ (not depicted for clarity), and so on. The last weight matrix includes $w^{MC}_1, w^{MC}_2, w^{MC}_3$, and $w^{MC}_4$ (not depicted for clarity).

Input feature maps 204 include C input data matrices, each including 36 input activations (6×6). The first input feature map $204_1$ includes $a^1_1, \ldots, a^1_{36}$ (depicted), the second input feature map $204_2$ includes $a^2_1, \ldots, a^2_{36}$ (not depicted for clarity), and so on. The last input data matrix $204_c$ includes $a^C_1, \ldots, a^C_{36}$ (not depicted for clarity), Output feature maps 206 include M output data matrices, each including 25 output activations (5×5). The first output feature map $206_1$ includes $o^1_1, \ldots, o^1_{25}$ (depicted), the second output feature map $206_2$ includes $o^2_1, \ldots, o^2_{25}$ (not depicted for clarity), and so on. The last output feature map $206_M$ includes $o^M_1, \ldots, o^M_{25}$ (not depicted for clarity).

NVM crossbar module 302 includes DACs $310_1, \ldots, 310_N$, NVM crossbar 303, and ADCs $320_1, \ldots, 320_M$. NVM crossbar 303 includes N row signal lines 308, i.e., row signal lines $308_1, \ldots, 308_N$ (where N equals 2×2×C or 4C), M column signal lines 312, i.e., column signal lines $312_1, \ldots, 312_M$, and an NVM cell 314 disposed at each intersection of row signal lines $308_1, \ldots, 308_N$ and column signal lines $312_1, \ldots, 312_M$, i.e., NVM cells $314_{11}, \ldots, 314_{NM}$. DACs $310_1, \ldots, 310_N$ are coupled to row signal lines $308_1, \ldots, 308_N$, and ADCs $320_1, \ldots, 320_M$ are coupled to column signal lines $312_1, \ldots, 312_M$. Each NVM cell 314 includes one or more NVM elements whose conductance is programmed to be proportional to a particular weight.

For example, for column signal line $312_1$, NVM cell $314_{11}$ is programmed to a conductance value that is proportional to $w^{11}_1$, NVM cell $314_{21}$ is programmed to a conductance value that is proportional to $w^{11}_2$, NVM cell $314_{N1}$ is programmed to a conductance value that is proportional to $w^{1C}_4$, etc. The remaining NVM cells 314 in NVM crossbar 303 are programmed in the same manner.

The accumulated dot-products of the input data and weights along each column signal line 312 may be represented by Equation 1, where N equals 2×2×C or 4C.

Convolution layer operation 200 is first converted into a simple matrix MAC operation by converting filters $202_1, \ldots, 202_M$ into a converted weight matrix (M×(4C)), and converting input feature maps $204_1, \ldots, 204_C$ into a converted input data matrix ((4C)×25). The converted weight matrix and the converted input data matrix are multiplied to generate a converted output matrix (M×25), which is reformed into output feature maps $206_1, \ldots, 206_M$, each one being a 5×5 matrix.

Sequential column data from the converted input data matrix are provided to NVM crossbar module 302 as inputs to DACs $310_1, \ldots, 310_N$, which output respective analog voltages along row signal lines $308_1, \ldots, 308_N$ across NVM crossbar 303. Column signal lines $312_1, \ldots, 312_M$ convey corresponding signals $BL^1, \ldots, BL^M$, whose currents are proportional to the accumulated dot-products of the input data and weights along column signal lines $312_1, \ldots, 312_M$. Signals $BL^1, \ldots, BL^M$ are then digitized using ADCs $320_1, \ldots, 320_M$ to generate the elements of the converted output data matrix.

The converted output data matrix has M rows, each of which is reformed into a separate output feature map $206_1, \ldots, 206_M$. In order to calculate the first elements of each row of the converted output data matrix, i.e., element $o^1_1$ of output feature map $206_1$ to element $o^M_1$ of output feature map $206_M$, input data from the first column of the converted input data matrix are provided to NVM crossbar module 300 as inputs $a^1_1, a^1_2, a^1_7, a^1_8, a^2_1, a^2_2, a^2_7, a^2_8, a^C_1, a^C_2, a^C_7$ and $a^C_8$ to DACs $310_1, \ldots, 310_N$, respectively. DACs $310_1, \ldots, 310_N$ then output respective analog voltages along row signal lines $308_1, \ldots, 308_N$ across NVM crossbar 303. Column signal lines $312_1, \ldots, 312_M$ convey signals $BL^1, \ldots, BL^M$, whose currents are proportional to the accumulated dot-products of the input data and weights along column signal lines $312_1, \ldots, 312_M$. Signals $BL^1, \ldots, BL^M$ are then digitized using ADCs $320_1, \ldots, 320_M$ to obtain the first elements of the rows of the converted output data matrix. The remaining elements of the converted output data matrix are calculated in a similar manner.

An activation function and a bias may be applied to each element of the converted output data matrix to generate the elements of output feature maps $206_1, \ldots, 206_M$, which are then provided as input feature maps $204_1, \ldots, 204_M$ to the next layer. The activation function and bias may be applied after each element of the converted output data matrix is calculated, after all of the elements of the converted output data matrix are calculated, or by a subsequent locally-connected layer, such as an ReLU layer.

In many embodiments, NVM cells include an NVM resistive switching element that may be programmed to encode discrete, linearly-separated conductance values due to the wide separation between the low-resistance state (LRS), e.g., $R_{on}$, and the high-resistance state (HRS), e.g., $R_{off}$. For example, in the case of CeRAM, the ratio of HRS/LRS is at least 2-orders of magnitude, which supports 4-bit encoding (i.e., 16 discrete levels). Accordingly, the conductance of an NVM element may be programmed to a discrete number g in a positive range $[g_{off}, g_{on}]$. In many embodiments, $g_{off}$ is associated with the HRS, and $g_{on}$ is associated with the LRS.

Generally, ANN weights may be any real number, and may include both positive and negative values. Mapping both positive and negative weights to the same conductance set for an NVM crossbar may be problematic because the conductances may only be programmed within the positive range $[g_{off}, g_{on}]$. To mitigate these problems, positive and negative weights (i.e., bipolar weights) may be separated in an NVM crossbar.

Figure 3C:
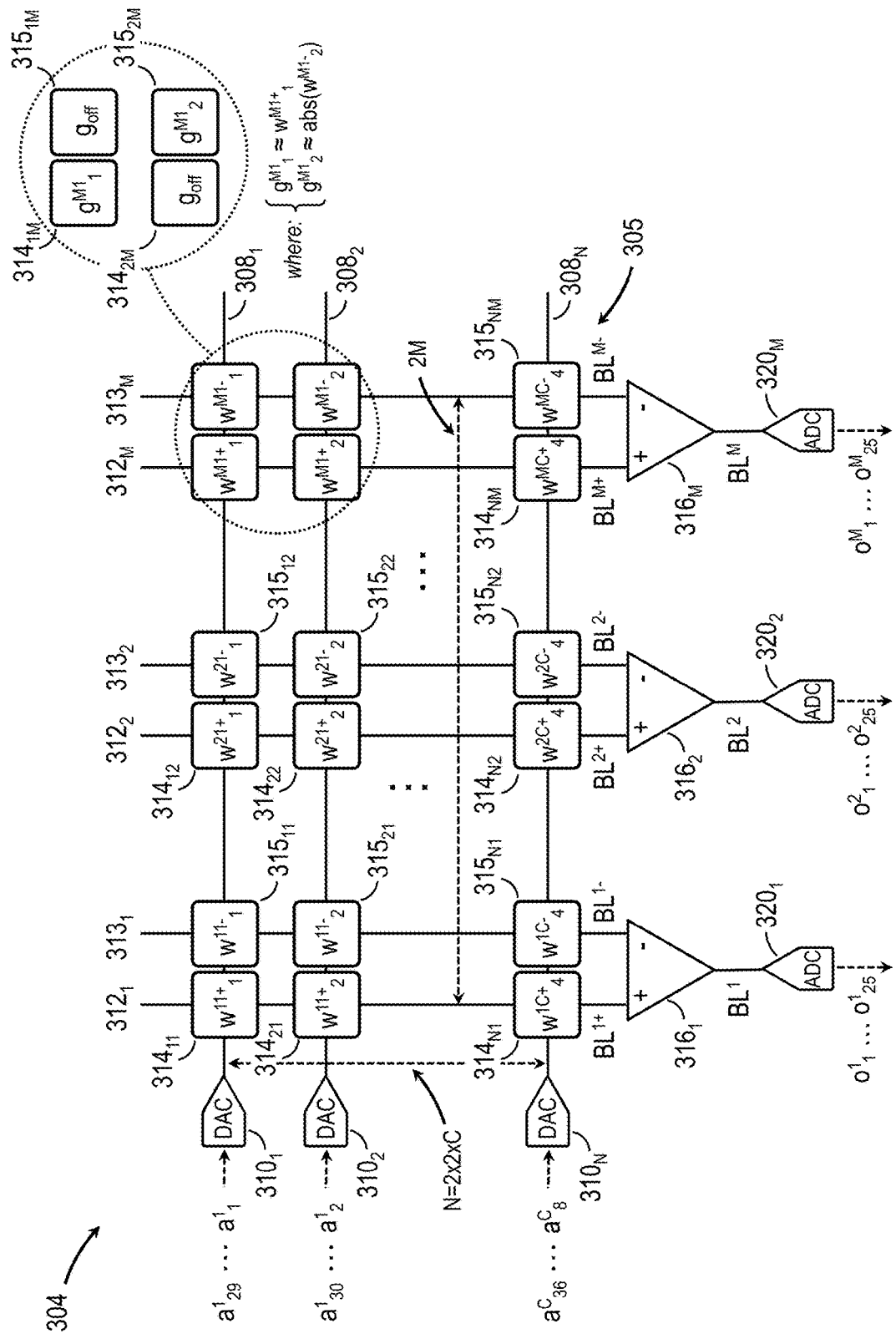
FIG. 3C depicts an NVM crossbar with bipolar filter weights.

FIG. 3C depicts an NVM crossbar module 304 with bipolar weights.

As discussed above, each NVM cell 314 of NVM crossbar 303 includes one or more NVM elements whose conductance is programmed to be proportional to a particular weight of filters 202, which may include both positive and negative values. Rather than a single NVM cell 314 for each weight and a single column signal line 312 for each output element o, NVM crossbar 305 includes a pair of NVM cells for each weight, i.e., NVM cell 314 and NVM cell 315, and a pair of column signal lines for each output element o, i.e., column signal line 312 and column signal line 313.

Each NVM cell 314 includes one or more NVM elements whose conductance is programmed to be proportional to the respective weight when the weight has a positive value (including zero). Similarly, each NVM cell 315 includes one or more NVM elements whose conductance is programmed to be proportional to the absolute value of the respective weight when the weight has a negative value (excluding zero). For each output element o, the accumulated current generated by column signal line 313 (i.e., the negative weight NVM cells) is subtracted from the accumulated current generated by column signal line 312 (i.e., the positive weight NVM cells) by subtraction block 316 before digitization by ADC 320.

More particularly, when the weight has a positive value, the respective NVM cell 314 is programmed to a discrete number g in a positive range $[g_{off}, g_{on}]$ that is proportional to the positive weight value, while the respective NVM cell 315 is programmed to $g_{off}$. In other words, the range of positive weight values $[0, w_{max}]$ is mapped to the range of positive conductance values $[g_{off}, g_{on}]$. Similarly, when the weight has a negative value, the respective NVM cell 315 is programmed to a discrete number g in a positive range $[g_{on}, g_{off}]$ that is proportional to the absolute value of the negative weight value, while the respective NVM cell 314 is programmed to $g_{off}$. In other words, the range of negative weight values $[-w_{min}, 0)$ is mapped to the range of positive conductance values $[g_{on}, g_{off}]$. For example, when $w^{M1}_1$ has a positive value, NVM cell $314_{1M}$ is programmed to a proportional conductance level of $g^{M1}_1$ and NVM cell $315_{1M}$ is programmed to $g_{off}$. Similarly, when $w^{M1}_2$ has a negative value, NVM cell $315_{2M}$ is programmed to a proportional conductance level of $g^{M1}_2$ and NVM cell $314_{2M}$ is programmed to $g_{off}$.

NVM crossbar module 304 includes DACs $310_1, \ldots, 310_N$, NVM crossbar 305, subtraction blocks $316_1, \ldots,$ $316_M$, and ADCs $320_1, \ldots, 320_M$. NVM crossbar 305 includes N row signal lines 308, i.e., row signal lines $308_1, \ldots, 308_N$ (where N equals 2×2×C or 4C), M column signal lines 312 for positive weights, i.e., column signal lines $312_1, \ldots, 312_M$, M column signal lines 313 for negative weights, i.e., column signal lines $313_1, \ldots, 313_M$. NVM cells 314 disposed at each intersection of row signal lines 308 and column signal lines 312, i.e., NVM cells $314_{11}, \ldots, 314_{NM}$, and NVM cells 315 disposed at each intersection of row signal lines 308 and column signal lines 313, i.e., NVM cells $315_{11}, \ldots, 315_{NM}$. DACs $310_1, \ldots, 310_N$ are coupled to row signal lines $308_1, \ldots, 308_N$, subtraction blocks $316_1, \ldots, 316_M$ are coupled to column signal lines $312_1, \ldots, 312_M$, and column signal lines $313_1, \ldots, 313_M$, and ADCs $320_1, \ldots, 320_M$ are coupled to subtraction blocks $316_1, \ldots, 316_M$. Compared to NVM crossbar 303, NVM crossbar 305 has twice as many cells and twice as many column signal lines.

As described above, convolution layer operation 200 is first converted into a simple matrix MAC operation. Sequential column data from the converted input data matrix are provided to NVM crossbar module 304 as inputs to DACs $310_1, \ldots, 310_N$, which output respective analog voltages along row signal lines $308_1, \ldots, 308_N$ across NVM crossbar 305. Column signal lines $312_1, \ldots, 312_M$ convey corresponding signals $BL^{1+}, \ldots, BL^{M+}$, whose currents are proportional to the accumulated dot-products of the input data and positive weights along column signal lines $312_1, \ldots, 312_M$. Column signal lines $313_1, \ldots, 313_M$ convey corresponding signals $BL^{1-}, \ldots, BL^{M-}$, whose currents are proportional to the accumulated dot-products of the input data and negative weights along column signal lines $313_1, \ldots, 313_M$. Subtraction blocks $316_1, \ldots, 316_M$ subtract signals $BL^{1-}, BL^{M-}$ from respective signals $BL^{1+}, \ldots, BL^{M+}$, and the difference signals $BL^1, \ldots, BL^M$ are then digitized using ADCs $320_1, \ldots, 320_M$ to generate the elements of the converted output data matrix. The converted output data matrix has M rows, each of which is reformed into a separate output feature map $206_1, \ldots, 206_M$.

For example, in order to calculate the first elements of each row of the converted output data matrix, i.e., element $o^1_1$ of output feature map $206_1$ to element $o^M_1$ of output feature map $206_M$, input data from the first column of the converted input data matrix are provided to NVM crossbar module 302 as inputs $a^1_1, a^1_2, a^1_7, a^1_8, a^2_1, a^2_2, a^2_7, a^2_8, \ldots, a^C_1, a^C_2, a^C_7$ and $a^C_8$ to DACs $310_1, \ldots, 310_N$, respectively. DACs $310_1, \ldots, 310_N$ then output respective analog voltages along row signal lines $308_1, \ldots, 308_N$ across NVM crossbar 303. Column signal lines $312_1, \ldots, 312_M$ convey corresponding signals $BL^{1+}, \ldots, BL^{M+}$, while column signal lines $313_1, \ldots, 313_M$ convey corresponding signals $BL^{1-}, \ldots, BL^{M-}$. Subtraction blocks $316_1, \ldots, 316_M$, subtract signals $BL^{1-}, \ldots, BL^{M-}$ from respective signals $BL^{1+}, \ldots, BL^{M+}$, and the difference signals $BL^1, \ldots, BL^M$ are then digitized using ADCs $320_1, \ldots, 320_M$ to obtain the first elements of the rows of the converted output data matrix. The remaining elements of the converted output data matrix are calculated in a similar manner.

As described above, an activation function and a bias may be applied to each element of the converted output data matrix to generate the elements of output feature maps $206_1, \ldots, 206_M$, which are then provided as input feature maps $204_1, \ldots, 204_M$ to the next layer. The activation function and bias may be applied after each element of the converted output data matrix is calculated, after all of the elements of the converted output data matrix are calculated, or by a subsequent locally-connected layer, such as an ReLU layer.

NVM crossbar module 304 has several disadvantages when compared to NVM crossbar module 302. The area of NVM crossbar 305 has doubled due to the addition of column signal lines 313 and NVM cells 315, and subtraction blocks 316 have been added before ADCs 320. Doubling the number of NVM cells in NVM crossbar 305 introduces spurious noise contributions to the accumulated dot products which causes accuracy problems. These noise contributions depend on the dynamic range and variability of the NVM elements within each NVM cell, as well as the size of the crossbar, and manifest themselves as undesirable currents along column signal lines 312, 313 that are generated by NVM cells 314, 315 programmed to $g_{off}$. The total current ($i_{b+}$) flowing through column signal lines $312_1, \ldots, 312_M$ may be calculated by Equation 2, while the total current ($i_{b-}$) flowing through column signal lines $313_1, \ldots, 313_M$ may be calculated by Equation 3.

$$i_{b+} = \sum_a^M \sum_b^N v_{ab} m(w_{ab}, +1) \quad \text{(Eq. 2)}$$

$$i_{b-} = \sum_a^M \sum_b^N v_{ab} m(w_{ab}, -1) \quad \text{(Eq. 3)}$$

where the mapping function bipolar m is defined by Equation 4, which uses the auxiliary mapping function m'(w) to map a positive weight to the conductance range, and the absolute value of a negative weight to the conductance range.

$$m(w, p) = \begin{cases} m'(w), & \text{if } w > 0 \text{ and } p > 0 \\ m'(\text{abs}(w)), & \text{if } w < 0 \text{ and } p < 0, \\ g_{OFF}, & \text{otherwise} \end{cases} \quad \text{(Eq. 4)}$$

In other words, each NVM cell 314, 315 that is programmed to $g_{off}$ adds a current contribution to the respective column signal line 312, 313 that is equal to the product of $g_{off}$ and the voltage provided by the respective row signal line 308. If the number of NVM cells 314 that are programmed to $g_{off}$ in a particular column signal line 312 is the same as the number of NVM cells 315 that are programmed to $g_{off}$ in the respective column signal line 313, then the undesirable currents in each column signal line will generally negate one another during the subtraction process performed by respective subtraction block 316. However, if the weights for any particular pair of column signal lines 312, 313 are predominantly positive or predominantly negative, then the undesirable currents generated by NVM cells 314 or NVM cells 315 that are programmed to $g_{off}$ will cause accuracy problems.

Embodiments of the present disclosure advantageously provide an NVM crossbar with unipolar weights that significantly reduces the spurious noise contributions caused by undesirable currents that are generated by NVM cells that are programmed to a conductance value of $g_{off}$.

As discussed above, ANN weights can be any real number, and include both positive and negative values. NVM crossbars 301 and 303 include NVM cells 314 that are programmable to represent any positive or negative ANN weight value (i.e., multipolar weights). NVM crossbar module 304 includes NVM cells 314 that are programmable to represent any positive ANN weight value, and NVM cells 315 that are programmable to represent any negative ANN weight value (i.e., bipolar weights). NVM crossbars that implement multipolar and bipolar weights each have their respective advantages and disadvantages.

Certain ANNs, such as DNNs, CNNs, etc., may have one or more layers that are trained to include only positive weight values (i.e., unipolar weights), generally in combination with a quantization scheme, such as, for example, 4-bit (8-bit, etc.) quantization with uniform scaling, 4-bit (8-bit, etc.) quantization with straight through estimation (STE), etc. An NVM crossbar with unipolar weights advantageously gains some of the benefits of an NVM crossbar with bipolar weights (e.g., NVM crossbar 305) while retaining the smaller size of an NVM crossbar with multipolar weights (e.g., NVM crossbars 301 and 303).

Generally, unipolar weights have a range of values from zero to a maximum, positive value (integer or real). Because an NVM cell that represents a unipolar weight that has a value of zero will be programmed to $g_{off}$, an undesirable current will be generated by that NVM cell that may cause accuracy problems. These undesirable currents may be negligible if the NVM crossbar is small, the programmable NVM element(s) within each NVM cell are small and the $g_{on}/g_{off}$ ratio is large. Alternatively, these undesirable currents may be negligible if the ANN layer is extremely dense and not sparse (i.e., the ANN layer does not include a large number of unipolar weights that have zero values). Otherwise, the errors that are accumulated on the column signal lines due to the undesirable currents may significantly decrease the accuracy of the ANN.

Embodiments of the present disclosure advantageously provide an NVM crossbar with unipolar weights that includes an additional column signal line with additional NVM cells that are programmed to represent a vector or set of correction weights. The correction current generated along the additional column signal line by the additional NVM cells is used to correct the undesirable currents generated along each of the remaining column signal lines caused by the NVM cells that are programmed to $g_{off}$. In certain embodiments, the correction weights are simply set to zero, and the additional NVM cells are programmed to $g_{off}$. In other embodiments, the correction weights may be advantageously determined during training of the ANN.

Figure 4A:
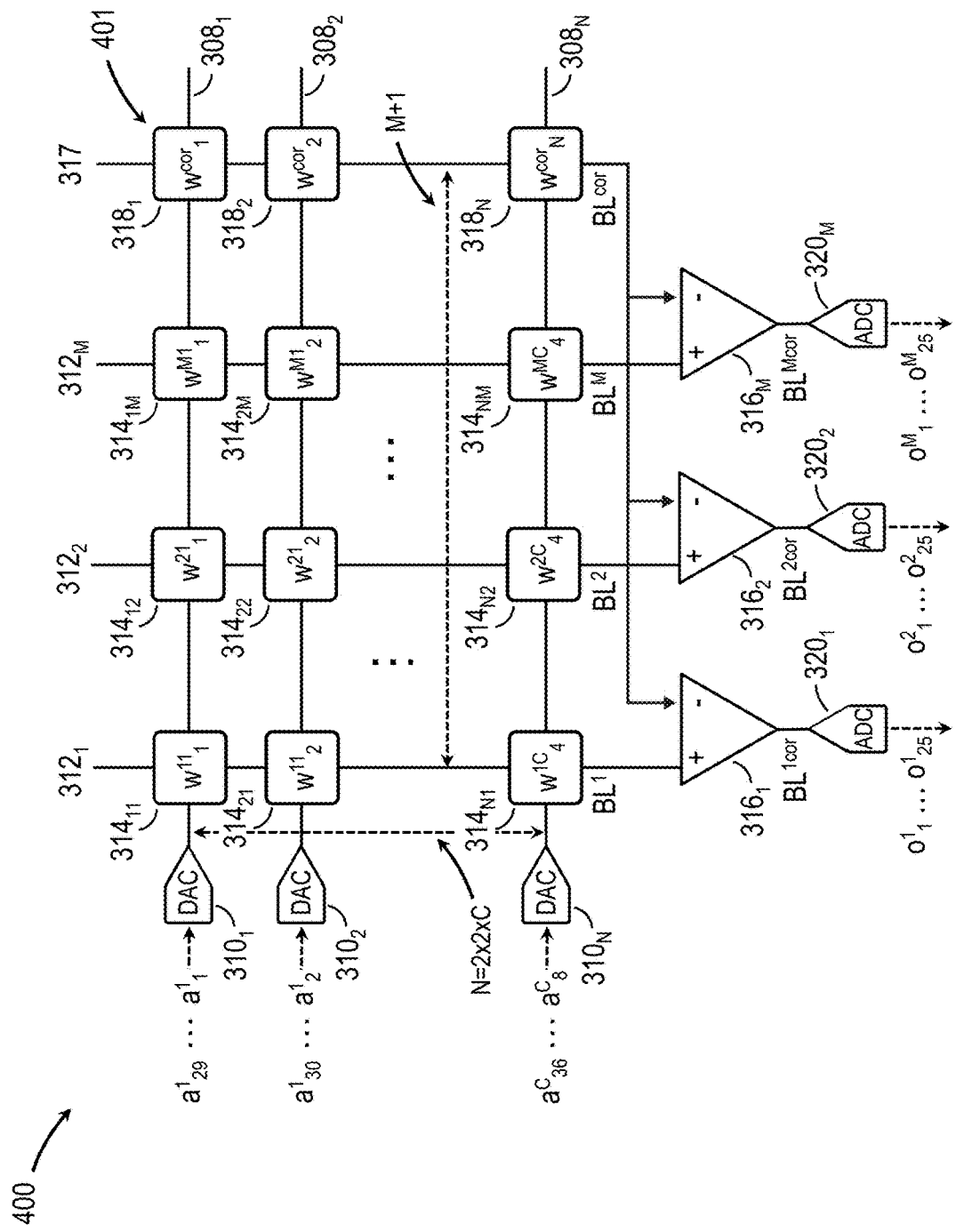
FIG. 4A depicts a portion of the convolutional layer operation of FIG. 2B implemented using an NVM crossbar with unipolar weights, in accordance with an embodiment of the present disclosure.

FIG. 4A depicts a portion of convolutional layer operation 200 of FIG. 2B implemented using NVM crossbar module 400 with unipolar weights, in accordance with an embodiment of the present disclosure.

NVM crossbar module 400 includes DACs $310_1, \ldots, 310_N$, NVM crossbar 401, subtraction blocks $316_1, \ldots, 316_M$ and ADCs $320_1, \ldots, 320_M$. NVM crossbar 401 includes N row signal lines 308, i.e., row signal lines $308_1, \ldots, 308_N$ (where N equals 2×2×C or 4C), M column signal lines 312, i.e., column signal lines $312_1, \ldots, 312_M$, column signal line 317, an NVM cell 314 disposed at each intersection of row signal lines 308 and column signal lines 312, i.e., NVM cells $314_{11}, \ldots, 314_{NM}$, and an NVM cell 318 disposed at each intersection of row signal lines 308 and column signal line 317, i.e., NVM cells $318_1, \ldots, 318_M$. DACs $310_1, \ldots, 310_N$ are coupled to row signal lines $308_1, \ldots, 308_N$, subtraction blocks $316_1, \ldots, 316_M$ are coupled to column signal lines $312_1, \ldots, 312_M$ and 317, and ADCs $320_1, \ldots, 320_M$ are coupled to subtraction blocks $316_1, \ldots, 316_M$. Each NVM cell 314, 318 includes one or more NVM elements whose conductance is programmed to be proportional to a particular weight value.

For example, for column signal line $312_1$, NVM cell $314_{11}$ is programmed to a conductance value that is proportional to $w^{11}_1$, NVM cell $314_{21}$ is programmed to a conductance value that is proportional to $w^{11}_2$, NVM cell $314_{N1}$ is programmed to a conductance value that is proportional to $w^{1C}_4$, etc. The remaining NVM cells 314 in NVM crossbar module 302 are programmed in the same manner. Similarly, for column signal line 317, NVM cell $318_1$ is programmed to a conductance value that is proportional to $w^{cor}_1$, NVM cell $318_2$ is programmed to a conductance value that is proportional to $w^{cor}_2$, NVM cell $318_N$ is programmed to a conductance value that is proportional to $w^{cor}_N$, etc.

Column signal lines 312 are also known as MAC signal lines 312, NVM cells 314 are also known as MAC cells 314, column signal line 317 is also known as correction signal line 317, and NVM cells 318 are also known as correction cells 318. The accumulated dot-products of the input data and weights along each column signal line 312, 317 may be represented by Equation 1, where N equals 2×2×C or 4C.

Convolution layer operation 200 is first converted into a simple matrix MAC operation by converting filters $202_1, \ldots, 202_M$ into a converted weight matrix (M×(4C)), and converting input feature maps $204_1, \ldots, 204_C$ into a converted input data matrix ((4C)×25). The converted weight matrix and the converted input data matrix are multiplied to generate a converted output matrix (M×25), which is reformed into output feature maps $206_1, \ldots, 206_M$, each one being a 5×5 matrix.

Sequential column data from the converted input data matrix are provided to NVM crossbar module 400 as inputs to DACs $310_1, \ldots, 310_N$, which output respective analog voltages along row signal lines $308_1, \ldots, 308_N$ across NVM crossbar 401. Column signal lines $312_1, \ldots, 312_M$ convey corresponding signals $BL^1, \ldots, BL^M$, whose currents are proportional to the accumulated dot-products of the input data and unipolar weights along column signal lines $312_1, \ldots, 312_M$. Column signal line 317 conveys a corresponding signal $BL^{cor}$, whose current is proportional to the accumulated dot-products of the input data and correction weights along column signal line 317.

In this embodiment, subtraction blocks $316_1, \ldots, 316_M$ subtract the correction signal $BL^{cor}$ from respective signals $BL^1, \ldots, BL^M$, and the corrected signals $BL^{1cor}, \ldots, BL^{Mcor}$ then digitized using ADCs $320_1, \ldots, 320_M$ to generate the elements of the converted output data matrix.

Advantageously, the correction signal $BL^{cor}$ generally solves the spurious noise problems related to zero-valued weights. For example, filter 202 for a CNN layer may have a sparsity of 90%, i.e., 90% of the weights have a value of zero. Accordingly, 90% of NVM cells $314_{11}, \ldots, 314_{NM}$ will be programmed to a conductance value of $g_{off}$, and only 10% of NVM cells $314_{11}, \ldots, 314_{NM}$ will encode information. The noise introduced by the resistive elements of 90% of NVM cells $314_{11}, \ldots, 314_{NM}$ will be large enough to affect the accumulated dot-products of the input data and non-zero weights along each column signal line $312_1, \ldots, 312_M$.

In certain embodiments, the corrected weights $w^{cor}_1, \ldots w^{cor}_N$ are set to zero, NVM cells $318_1, \ldots, 318_N$ are programmed to a conductance level of $g_{off}$. For the 90% sparsity example, subtraction of the correction signal $BL^{cor}$ from each of the signals $BL^1, \ldots, BL^M$ removes the undesirable currents generated by 90% of NVM cells $314_{11}, \ldots, 314_{NM}$ (i.e., those NVM cells that are programmed to a conductance level of $g_{off}$), while only introducing a small, negative correction to 10% of NVM cells $314_{11}, \ldots, 314_{NM}$ (i.e., those NVM cells that are programmed to a conductance level grater than $g_{off}$). In other embodiments, the corrected weights $w^{cor}_1, \ldots w^{cor}_N$ are selected, during the training of the CNN, not only to remove the undesirable currents generated by 90% of NVM cells $314_{11}, \ldots, 314_{NM}$, but also to minimize the effect of the small, negative correction to 10% of NVM cells $314_{11}, \ldots, 314_{NM}$.

For example, a 3-layer classification DNN, implemented using NVM crossbar modules 304 with bipolar weights deployed in the first two layers, achieved an accuracy of 97.8%. Advantageously, the same 3-layer classification DNN, implemented using NVM crossbar modules 400 with unipolar weights deployed in the first two layers, achieved an accuracy of 95%.

The converted output data matrix has M rows, each of which is reformed into a separate output feature map $206_1, \ldots, 206_M$. In order to calculate the first elements of each row of the converted output data matrix, i.e., element $o^1_1$ of output feature map $206_1$ to element $o^M_1$ of output feature map $206_M$, input data from the first column of the converted input data matrix are provided to NVM crossbar module 400 as inputs $a^1_1, a^1_2, a^1_7, a^1_8, a^2_1, a^2_2, a^2_7, a^2_8, \ldots, a^C_1, a^C_2, a^C_7$ and $a^C_8$ to DACs $310_1, \ldots, 310_N$, respectively. DACs $310_1, \ldots, 310_N$ then output respective analog voltages along row signal lines $308_1, \ldots, 308_N$ across NVM crossbar 401.

Column signal lines $312_1, \ldots, 312_M$ convey signals $BL^1, \ldots, BL^M$, whose currents are proportional to the accumulated dot-products of the input data and unipolar weights along column signal lines $312_1, \ldots, 312_M$. Column signal line 317 conveys a corresponding signal $BL^{cor}$, whose current is proportional to the accumulated dot-products of the input data and correction weights along column signal line 317. The correction signal $BL^{cor}$ is then subtracted from respective signals $BL^1, \ldots, BL^M$ by subtraction blocks $316_1, \ldots, 316_M$, respectively, and the corrected signals $BL^{1cor}, \ldots, BL^{Mcor}$ are then digitized using ADCs $320_1, \ldots, 320_M$ to generate the first elements of the rows of the converted output data matrix. The remaining elements of the converted output data matrix are calculated in a similar manner.

An activation function and a bias may be applied to each element of the converted output data matrix to generate the elements of output feature maps $206_1, \ldots, 206_M$, which are then provided as input feature maps $204_1, \ldots, 204_M$ to the next layer. The activation function and bias may be applied after each element of the converted output data matrix is calculated, after all of the elements of the converted output data matrix are calculated, or by a subsequent locally-connected layer, such as an ReLU layer.

Figure 4B:
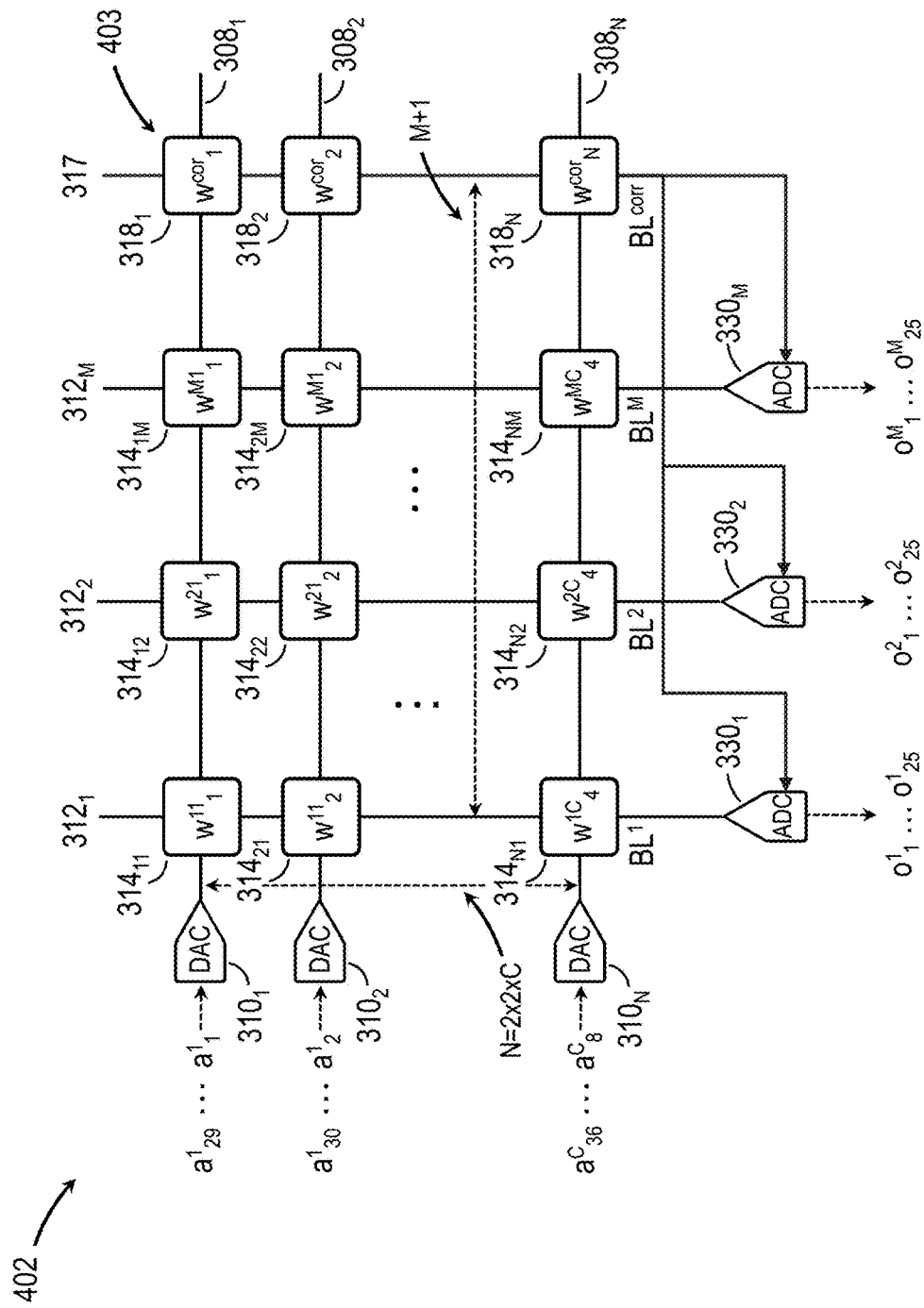
FIG. 4B depicts a portion of the convolutional layer operation of FIG. 2B implemented using an NVM crossbar with unipolar weights, in accordance with another embodiment of the present disclosure.

FIG. 4B depicts a portion of convolutional layer operation 200 of FIG. 2B implemented using NVM crossbar module 402 with unipolar weights, in accordance with another embodiment of the present disclosure.

NVM crossbar module 402 includes DACs $310_1, \ldots, 310_N$, NVM crossbar 403, and ADCs $320_1, \ldots, 320_M$. NVM crossbar 403 includes N row signal lines 308, i.e., row signal lines $308_1, \ldots, 308_N$ (where N equals 2×2×C or 4C), M+1 column signal lines 312, i.e., column signal lines $312_1, \ldots, 312_M$ and column signal line 317, an NVM cell 314 disposed at each intersection of row signal lines 308 and column signal lines 312, i.e., NVM cells $314_{11}, \ldots, 314_{NM}$, and an NVM cell 318 disposed at each intersection of row signal lines 308 and column signal line 317, i.e., NVM cells $318_1, \ldots, 318_M$. DACs $310_1, \ldots, 310_N$ are coupled to row signal lines $308_1, \ldots, 308_N$, and ADCs $320_1, \ldots, 320_M$ are coupled to column signal lines $312_1, \ldots, 312_M$. Each NVM cell 314, 318 includes one or more NVM elements whose conductance is programmed to be proportional to a particular weight.

For example, for column signal line $312_1$, NVM cell $314_{11}$ is programmed to a conductance value that is proportional to $w^{11}_1$, NVM cell $314_{21}$ is programmed to a conductance value that is proportional to $w^{11}_2$, NVM cell $314_{N1}$ is programmed to a conductance value that is proportional to $w^{1C}_4$, etc. The remaining NVM cells 314 in NVM crossbar module 302 are programmed in the same manner. Similarly, for column signal line 317, NVM cell $318_1$ is programmed to a conductance value that is proportional to $w^{cor}_1$, NVM cell $318_2$ is programmed to a conductance value that is proportional to $w^{cor}_2$, NVM cell $318_N$ is programmed to a conductance value that is proportional to $w^{cor}_N$, etc.

As discussed above, column signal lines 312 are also known as MAC signal lines 312, NVM cells 314 are also known as MAC cells 314, column signal line 317 is also known as correction signal line 317, and NVM cells 318 are also known as correction cells 318.

The accumulated dot-products of the input data and weights along each column signal line 312, 317 may be represented by Equation 1, where N equals 2×2×C or 4C.

Convolution layer operation 200 is first converted into a simple matrix MAC operation by converting filters $202_1, \ldots, 202_M$ into a converted weight matrix (M×(4C)), and converting input feature maps $204_1, \ldots, 204_C$ into a converted input data matrix ((4C)×25). The converted weight matrix and the converted input data matrix are multiplied to generate a converted output matrix (M×25), which is reformed into output feature maps $206_1, \ldots, 206_M$, each one being a 5×5 matrix.

Sequential column data from the converted input data matrix are provided to NVM crossbar module 402 as inputs to DACs $310_1, \ldots, 310_N$, which output respective analog voltages along row signal lines $308_1, \ldots, 308_N$ across NVM crossbar 403. Column signal lines $312_1, \ldots, 312_M$ convey corresponding signals $BL^1, \ldots, BL^M$, whose currents are proportional to the accumulated dot-products of the input data and unipolar weights along column signal lines $312_1, \ldots, 312_M$. Column signal line 317 conveys a corresponding signal $BL^{cor}$, whose current is proportional to the accumulated dot-products of the input data and correction weights along column signal line 317.

In this embodiment, the correction signal $BL^{cor}$ is provided to each ADC $320_1, \ldots, 320_M$ and used to adjust the reference voltage $V_{ref}$ used by each ADC. For example, the correction signal $BL^{cor}$ may be converted from a current signal to a voltage signal and subtracted from $V_{ref}$ to generated a new reference voltage $V_{ref}^{cor}$, which is used by the ADC when digitizing signals $BL^1, \ldots, BL^M$. Accordingly, when signals $BL^1, \ldots, BL^M$ are digitized by ADCs $320_1, \ldots, 320_M$ to generate the elements of the converted output data matrix, each signal $BL^1, \ldots, BL^M$ is corrected in a manner that is proportional to signal $BL^{cor}$. As discussed above, the correction signal $BL^{cor}$ generally solves the spurious noise problems related to zero-valued weights.

The converted output data matrix has M rows, each of which is reformed into a separate output feature map $206_1, \ldots, 206_M$. In order to calculate the first elements of each row of the converted output data matrix, i.e., element $o^1_1$ of output feature map $206_1$ to element $o^M_1$ of output feature map $206_M$, input data from the first column of the converted input data matrix are provided to NVM crossbar module 402 as inputs $a^1_1, a^1_2, a^1_7, a^1_8, a^2_1, a^2_2, a^2_7, a^2_8, a^C_1, a^C_2, a^C_7$ and $a^C_8$ to DACs $310_1, \ldots, 310_N$, respectively. DACs $310_1, \ldots, 310_N$ then output respective analog voltages along row signal lines $308_1, \ldots, 308_N$ across NVM crossbar 403.

Column signal lines $312_1, \ldots, 312_M$ convey signals $BL^1, \ldots, BL^M$, whose currents are proportional to the accumulated dot-products of the input data and unipolar weights along column signal lines $312_1, \ldots, 312_M$. Column signal line 317 conveys a corresponding signal $BL^{cor}$, whose current is proportional to the accumulated dot-products of the input data and correction weights along column signal line 317. The correction signal $BL^{cor}$ is provided to ADCs $320_1, \ldots, 320_M$, and the signals $BL^1, \ldots, BL^M$ are then digitized using ADCs $320_1, \ldots, 320_M$ to generate the first elements of the rows of the converted output data matrix. The remaining elements of the converted output data matrix are calculated in a similar manner.

An activation function and a bias may be applied to each element of the converted output data matrix to generate the elements of output feature maps $206_1, \ldots, 206_M$, which are then provided as input feature maps $204_1, \ldots, 204_M$ to the next layer. The activation function and bias may be applied after each element of the converted output data matrix is calculated, after all of the elements of the converted output data matrix are calculated, or by a subsequent locally-connected layer, such as an ReLU layer.

Figure 5:
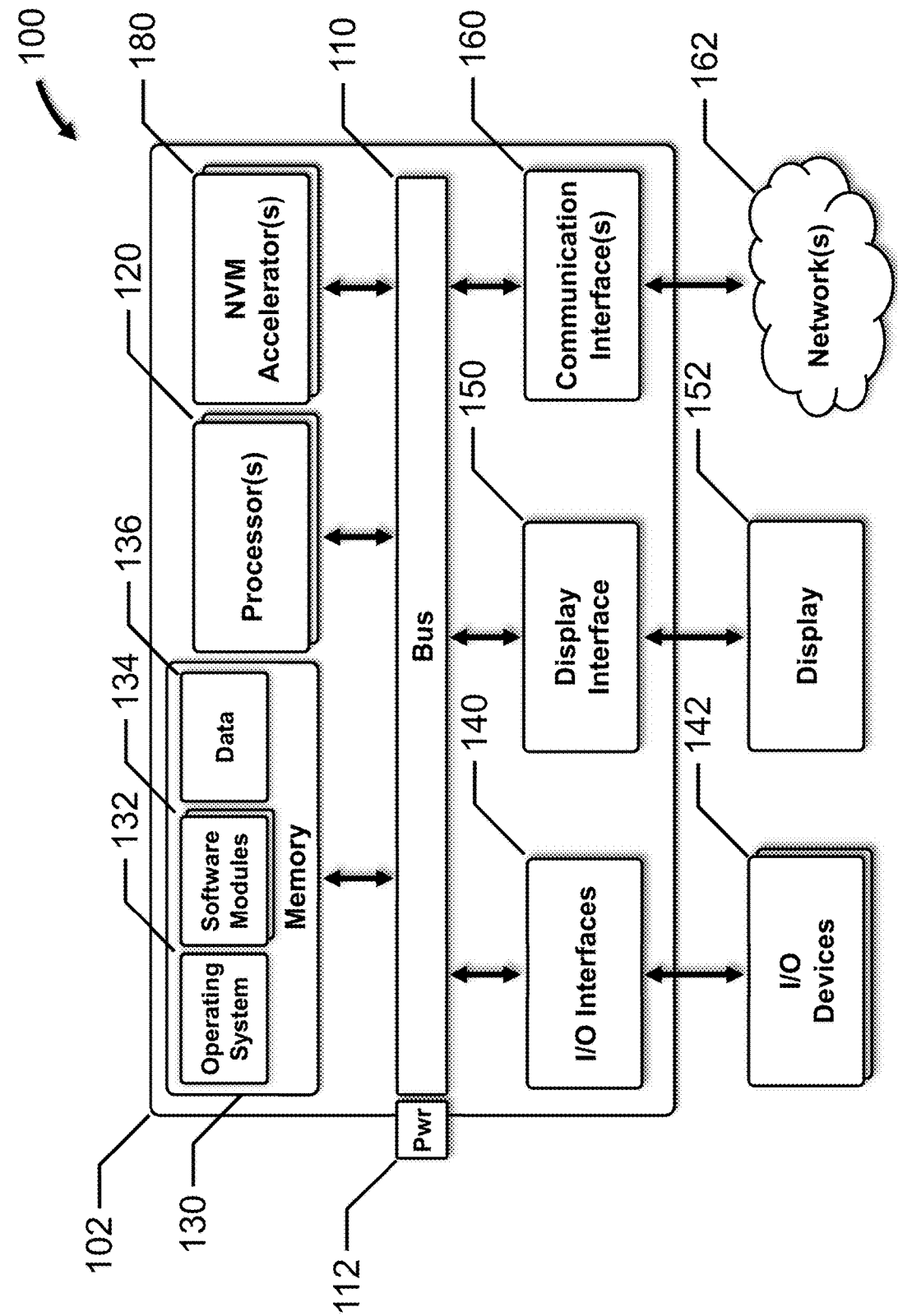
FIG. 5 depicts a block diagram of a system, in accordance with an embodiment of the present disclosure.

FIG. 5 depicts a block diagram of system 100, in accordance with an embodiment of the present disclosure.

Computer 102 includes communication bus 110 coupled to one or more processors 120, memory 130, I/O interfaces 140, display interface 150, one or more communication interfaces 160 and one or more NVM accelerators 170. Generally, I/O interfaces 140 are coupled to I/O devices 142 using a wired or wireless connection, display interface 150 is coupled to display 152, and communication interface 160 is connected to network 162 using a wired or wireless connection.

Communication bus 110 is a communication system that transfers data between processor 120, memory 130, I/O interfaces 140, display interface 150, communication interface 160, NVM accelerator 170, as well as other components not depicted. Power connector 112 is coupled to communication bus 110 and a power supply (not shown).

Processor 120 includes one or more general-purpose or application-specific microprocessors that executes instructions to perform control, computation, input/output, etc. functions for computer 102. Processor 120 may include a single integrated circuit, such as a micro-processing device, or multiple integrated circuit devices and/or circuit boards working in cooperation to accomplish the functions of processor 120. In addition, processor 120 may execute computer programs or modules, such as operating system 132, software modules 134, etc., stored within memory 130. For example, software modules 134 may include an ML application, an ANN application, a CNN application, etc.

Generally, storage element or memory 130 stores instructions for execution by processor 120 and data. Memory 130 may include a variety of non-transitory computer-readable medium that may be accessed by processor 120. In various embodiments, memory 130 may include volatile and non-volatile medium, non-removable medium and/or removable medium. For example, memory 130 may include any combination of random access memory (RAM), dynamic RAM (DRAM), static RAM (SRAM), read only memory (ROM), flash memory, cache memory, and/or any other type of non-transitory computer-readable medium.

Memory 130 contains various components for retrieving, presenting, modifying, and storing data. For example, memory 130 stores software modules that provide functionality when executed by processor 120. The software modules include operating system 132 that provides operating system functionality for computer 102. Software modules 134 provide various functionality, such as image classification using convolutional neural networks, etc. Data 136 may include data associated with operating system 132, software modules 134, etc.

I/O interfaces 140 are configured to transmit and/or receive data from I/O devices 142. I/O interfaces 140 enable connectivity between processor 120 and I/O devices 142 by encoding data to be sent from processor 120 to I/O devices 142, and decoding data received from I/O devices 142 for processor 120. Generally, data may be sent over wired and/or wireless connections. For example, I/O interfaces 140 may include one or more wired communications interfaces, such as USB, Ethernet, etc., and/or one or more wireless communications interfaces, coupled to one or more antennas, such as WiFi, Bluetooth, cellular, etc.

Generally, I/O devices 142 provide input to computer 102 and/or output from computer 102. As discussed above, I/O devices 142 are operably connected to computer 102 using a wired and/or wireless connection. I/O devices 142 may include a local processor coupled to a communication interface that is configured to communicate with computer 102 using the wired and/or wireless connection. For example, I/O devices 142 may include a keyboard, mouse, touch pad, joystick, etc.

Display interface 150 is configured to transmit image data from computer 102 to monitor or display 152.

Communication interface 160 is configured to transmit data to and from network 162 using one or more wired and/or wireless connections. Network 162 may include one or more local area networks, wide area networks, the Internet, etc., which may execute various network protocols, such as, for example, wired and/or wireless Ethernet, Bluetooth, etc. Network 162 may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

Figure 6:
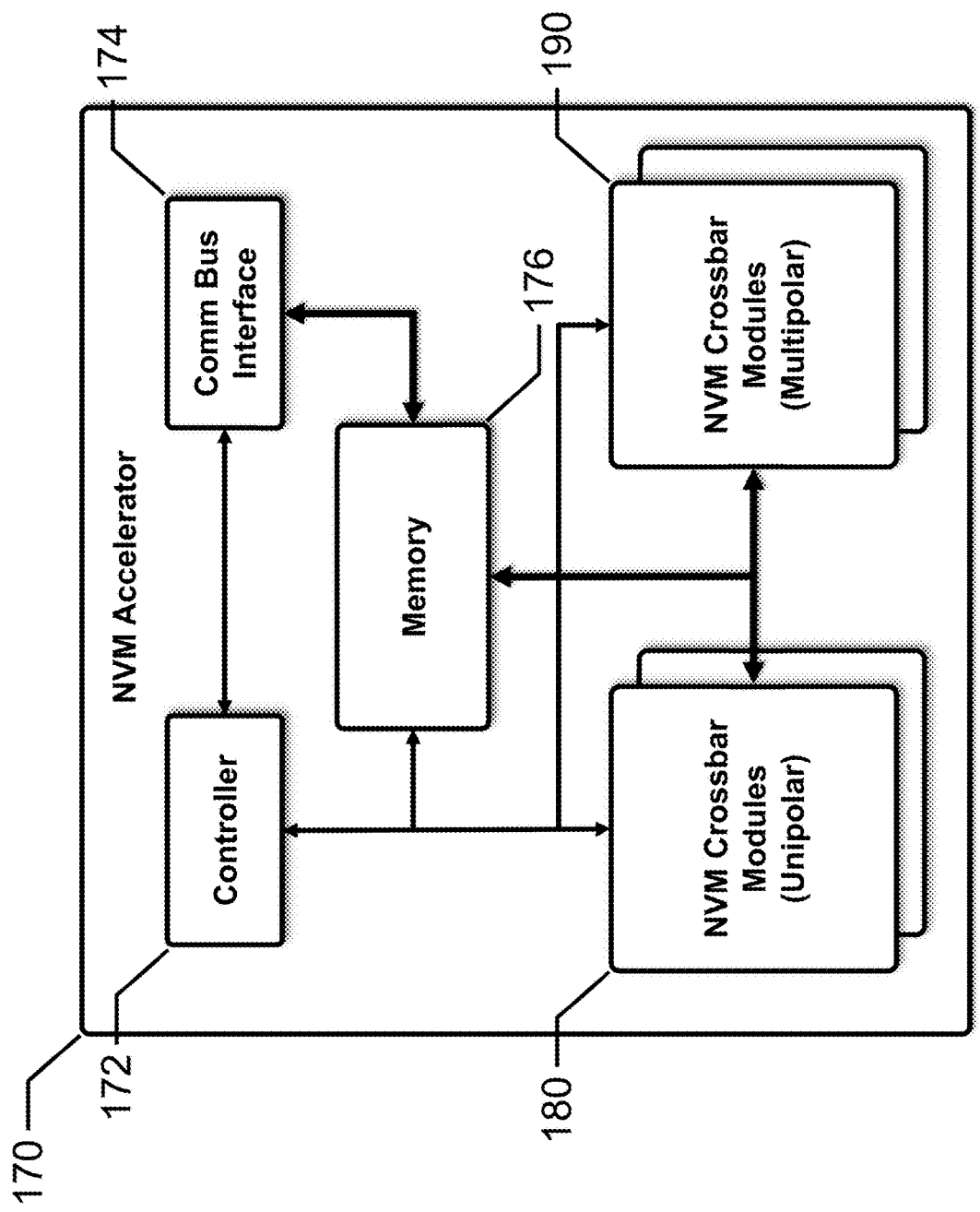
FIG. 6 depicts a block diagram of an NVM accelerator, in accordance with an embodiment of the present disclosure.

FIG. 6 depicts a block diagram of NVM accelerator 170, in accordance with an embodiment of the present disclosure.

Generally, NVM accelerator 170 receives input data from memory 130 over communication bus 110, transmits output data to memory 130 over communication bus 110, and is configured to execute machine learning models, such as, for example, ANNs, DNNs, CNNs, etc., in support of various applications embodied by software modules 134.

NVM accelerator 170 includes one or more NVM crossbar modules 180 with unipolar weights, such as, for example, NVM crossbar module 400, NVM crossbar module 402, etc., and one or more NVM crossbar modules 190 with multipolar weights, such as, for example, NVM crossbar module 300, etc. In many embodiments, each NVM crossbar module 180, 190 implements a single layer of an ANN, DNN, CNN, etc. For example, one NVM crossbar module 180 may implement convolutional layer 30-1 of CNN 15, while one NVM crossbar module 190 may implement fully-connected layer 40 of CNN 15. NVM crossbar modules 180, 190 may be arranged according to the particular design of the ANN, DNN, CNN, etc. For example, the 3-layer classification DNN discussed above be implemented by NVM accelerator 170 using two NVM crossbar modules 180 with unipolar weights for the first two layers, disposed adjacent to one another, followed by one NVM crossbar module 190 for the final, fully-connected layer.

NVM accelerator 170 also includes controller 172, communications bus interface 174, and one or more non-volatile and/or volatile memories 176, such as, for example, ROM, flash memory, SRAM, DRAM, etc. Controller 172 is coupled to communication bus interface 174, memory 176 and NVM crossbar modules 180, 190, and generally controls the components, functions, data flow, etc. of NVM accelerator 170. Communication bus interface 174 is coupled to communication bus 110 and memory 176, which is coupled to NVM crossbar modules 180, 190. Memory 176 may be disposed in a central location on NVM accelerator 170, or memory 176 may be apportioned locally to each NVM crossbar module 180, 190.

Figure 7:
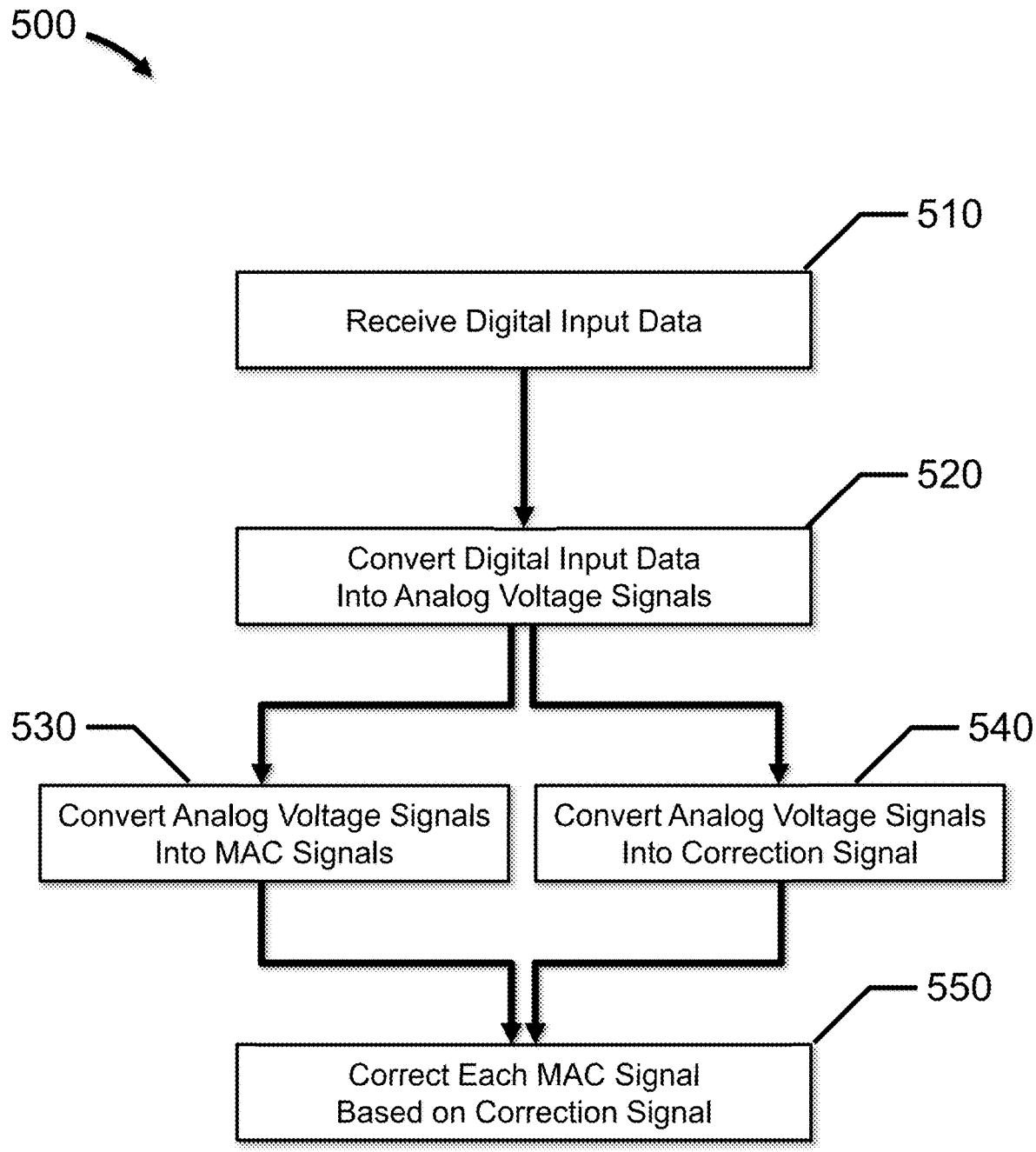
FIG. 7 depicts a flow diagram of a method for performing MAC operations for an ANN, in accordance with an embodiment of the present disclosure.

FIG. 7 depicts a flow diagram 500 of a method for performing MAC operations for an ANN, in accordance with an embodiment of the present disclosure.

At 510, a plurality of digital input data values are received at an NVM crossbar module 400, 402. NVM crossbar module 400, 402 includes a plurality of DACs 210, an NVM crossbar 401, 403 and a plurality of ADCs 320.

At 520, the digital input data are converted, by DACs 310, into a plurality of analog voltage signals. Flow then proceeds to 530 and 540 in parallel.

At 530, the analog voltage signals are converted, by the NVM crossbar 401, 403, into a plurality of MAC signals $BL^1, \ldots, BL^M$, using a plurality of MAC (NVM) cells 314, each including one or more NVM elements programmed to a conductance level representing one of a plurality of unipolar weights of an ANN, such as, for example, one of the unipolar weights of convolutional layer 30-1 of CNN 15.

At 540, the analog voltage signals are converted, by the NVM crossbar 401, 403, into a correction signal $BL^{cor}$ using a plurality of correction (NVM) cells 318, each including one or more NVM elements programmed to a predetermined conductance level.

At 550, each MAC signal $BL^1, \ldots, BL^M$ is corrected based on the correction signal $BL^{cor}$.

Embodiments of the present disclosure advantageously provide an NVM crossbar with unipolar weights that significantly reduces the spurious noise contributions caused by undesirable currents that are generated by NVM cells that are programmed to a conductance value of $g_{off}$.

The embodiments described herein are combinable.

In one embodiment, a non-volatile memory (NVM) crossbar includes a plurality of row signal lines configured to receive input analog voltage signals; a plurality of multiply-and-accumulate (MAC) column signal lines; a correction column signal line; a MAC cell disposed at each intersection of a row signal line and a MAC column signal line; and a correction cell disposed at each intersection of a row signal line and the correction column signal line. Each MAC cell includes one or more NVM elements programmed to a conductance level representing one of a plurality of unipolar weights of an ANN, and each correction cell includes one or more NVM elements programmed to a predetermined conductance level. Each MAC column signal line is configured to generate a MAC signal based on the input analog voltage signals and the respective MAC cells, and the correction column signal line is configured to generate a correction signal based on the input analog voltage signals and the correction cells. Each MAC signal is corrected based on the correction signal.

In another embodiment of the NVM crossbar module, each ADC is coupled to a respective MAC column signal line and configured to receive a respective MAC signal; each ADC is coupled to the correction column signal line and configured to receive the correction signal; and each ADC is configured to correct the respective MAC signal, based on the correction signal, prior to digitizing the respective MAC signal.

In another embodiment of the NVM crossbar module, each ADC has an adjustable reference voltage level; and each ADC is configured to correct the respective MAC signal by adjusting the adjustable reference voltage level based on the correction signal.

In another embodiment of the NVM crossbar module, each subtraction block is coupled to a respective MAC column signal line and configured to receive a respective MAC signal; each subtraction block is coupled to the correction column signal line and configured to receive the correction signal; each subtraction block is coupled to a respective ADC; each subtraction block is configured to correct the respective MAC signal by subtracting the correction signal from the respective MAC signal; and each subtraction block is configured to output the corrected MAC signal to the respective ADC.

In another embodiment of the NVM crossbar module, the conductance levels are discrete and range from a first conductance level, $g_{off}$, to a last conductance level, $g_{on}$.

In another embodiment of the NVM crossbar module, $g_{off}$ is associated with an NVM element high-resistance state, and $g_{on}$ is associated with an NVM element low resistance state.

In another embodiment of the NVM crossbar module, the predetermined conductance level is the first conductance level, $g_{off}$.

In another embodiment of the NVM crossbar module, the predetermined conductance level represents a correction weight determined during training of the ANN.

In one embodiment, a method for performing multiply-and-accumulate (MAC) operations for an artificial neural network (ANN) accelerator is provided. Digital input data is received at a non volatile memory (NVM) crossbar module including a plurality of digital-to-analog converters (DACs), an NVM crossbar and a plurality of analog-to-digital converters (ADCs). The digital input data is converted, by the DACs, into a plurality of analog voltage signals. The analog voltage signals are converted, by the NVM crossbar, into a plurality of MAC signals using a plurality of MAC cells, each MAC cell including one or more NVM elements programmed to a conductance level representing one of a plurality of unipolar weights of an ANN. The analog voltage signals are converted, by the NVM crossbar, into a correction signal using a plurality of correction cells, each correction cell including one or more NVM elements programmed to a predetermined conductance level. Each MAC signal is corrected based on the correction signal.

In another embodiment of the method, the NVM crossbar includes a plurality of row signal lines coupled to the DACs, a plurality of MAC column signal lines, and a correction column signal line; a MAC cell is disposed at each intersection of a row signal line and a MAC column signal line; a correction cell is disposed at each intersection of a row signal line and the correction column signal line; said converting the analog voltage signals into a plurality of MAC signals includes generating, by each MAC column signal line, a MAC signal based on the analog voltage signals and the respective MAC cells; and said converting the analog voltage signals into a correction signal includes generating, by the correction column signal line, the correction signal based on the analog voltage signals and the correction cells.

In another embodiment of the method, each ADC is coupled to a respective MAC column signal line and configured to receive a respective MAC signal; each ADC is coupled to the correction column signal line and configured to receive the correction signal; and said correcting each MAC signal includes correcting, by each ADC, the respective MAC signal prior to digitizing the respective MAC signal.

In another embodiment of the method, each ADC includes an adjustable reference voltage level; and said correcting each MAC signal includes correcting, by each ADC, the respective MAC signal by adjusting the adjustable reference voltage level based on the correction signal.

In another embodiment of the method, the NVM crossbar module includes a plurality of subtraction blocks; each subtraction block is coupled to a respective MAC column signal line and configured to receive a respective MAC signal; each subtraction block is coupled to the correction column signal line and configured to receive the correction signal; each subtraction block is coupled to a respective ADC; said correcting each MAC signal includes subtracting, by each subtraction block, the correction signal from the respective MAC signal; and each subtraction block is configured to output the corrected MAC signal to the respective ADC.

In another embodiment of the method, the conductance levels are discrete and range from a first conductance level, $g_{off}$, to a last conductance level, $g_{on}$.

In another embodiment of the method, $g_{off}$ is associated with an NVM element high resistance state, and $g_{on}$ is associated with an NVM element low resistance state.

In another embodiment of the method, the predetermined conductance level is the first conductance level, $g_{off}$.

In another embodiment of the method, the predetermined conductance level represents a correction weight determined during training of the ANN.

In one embodiment, a non-volatile memory (NVM) crossbar includes: a plurality of row signal lines configured to receive input analog voltage signals; a plurality of multiply-and-accumulate (MAC) column signal lines; a correction column signal line; a MAC cell disposed at each intersection of a row signal line and a MAC column signal line; and a correction cell disposed at each intersection of a row signal line and the correction column signal line. Each MAC cell includes one or more NVM elements programmed to a conductance level representing one of a plurality of unipolar weights of an ANN, and each correction cell includes one or more NVM elements programmed to a predetermined conductance level. Each MAC column signal line is configured to generate a MAC signal based on the input analog voltage signals and the respective MAC cells, and the correction column signal line is configured to generate a correction signal based on the input analog voltage signals and the correction cells. Each MAC signal is corrected based on the correction signal.

In another embodiment of the NVM crossbar, the conductance levels are discrete and range from a first conductance level, $g_{off}$, to a last conductance level, $g_{on}$; $g_{off}$ is associated with an NVM element high-resistance state; and $g_{on}$ is associated with an NVM element low resistance state.

In another embodiment of the NVM crossbar, the predetermined conductance level is the first conductance level, $g_{off}$; or the predetermined conductance level represents a correction weight determined during training of the ANN.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A non-volatile memory (NVM) crossbar module for an artificial neural network (ANN) accelerator, comprising:
    a plurality of digital-to-analog converters (DACs), each DAC configured to receive digital input data and output a respective analog voltage signal;
    an NVM crossbar including a plurality of row signal lines coupled to the DACs, a plurality of multiply-and-accumulate (MAC) column signal lines, a correction column signal line, a MAC cell disposed at each intersection of a row signal line and a MAC column signal line, and a correction cell disposed at each intersection of a row signal line and the correction column signal line; and
    a plurality of analog-to-digital converters (ADCs),
    where each MAC cell includes one or more NVM elements programmed to a conductance level representing one of a plurality of unipolar weights of an ANN, and each correction cell includes one or more NVM elements programmed to a predetermined conductance level,
    where each MAC column signal line is configured to generate a MAC signal based on the analog voltage signals and the respective MAC cells, and the correction column signal line is configured to generate a correction signal based on the analog voltage signals and the correction cells, and
    where each MAC signal is corrected based on the correction signal.

2. The NVM crossbar module of claim 1, where:
    each ADC is coupled to a respective MAC column signal line and configured to receive a respective MAC signal;
    each ADC is coupled to the correction column signal line and configured to receive the correction signal; and
    each ADC is configured to correct the respective MAC signal, based on the correction signal, prior to digitizing the respective MAC signal.

3. The NVM crossbar module of claim 2, where:
    each ADC has an adjustable reference voltage level; and
    each ADC is configured to correct the respective MAC signal by adjusting the adjustable reference voltage level based on the correction signal.

4. The NVM crossbar module of claim 1, further comprising a plurality of subtraction blocks, where:
    each subtraction block is coupled to a respective MAC column signal line and configured to receive a respective MAC signal;
    each subtraction block is coupled to the correction column signal line and configured to receive the correction signal;
    each subtraction block is coupled to a respective ADC;
    each subtraction block is configured to correct the respective MAC signal by subtracting the correction signal from the respective MAC signal; and
    each subtraction block is configured to output the corrected MAC signal to the respective ADC.

5. The NVM crossbar module of claim 1, where the conductance levels are discrete and range from a first conductance level, $g_{off}$, to a last conductance level, $g_{on}$.

6. The NVM crossbar module of claim 5, where $g_{off}$ is associated with an NVM element high-resistance state, and $g_{on}$ is associated with an NVM element low-resistance state.

7. The NVM crossbar module of claim 6, where the predetermined conductance level is the first conductance level, $g_{off}$.

8. The NVM crossbar module of claim 1, where the predetermined conductance level represents a correction weight determined during training of the ANN.

9. A method for performing multiply-and-accumulate (MAC) operations for an artificial neural network (ANN) accelerator, comprising:
    receiving digital input data at a non-volatile memory (NVM) crossbar module including a plurality of digital-to-analog converters (DACs), an NVM crossbar and a plurality of analog-to-digital converters (ADCs);
    converting, by the DACs, the digital input data into a plurality of analog voltage signals;
    converting, by the NVM crossbar, the analog voltage signals into a plurality of MAC signals using a plurality of MAC cells, each MAC cell including one or more NVM elements programmed to a conductance level representing one of a plurality of unipolar weights of an ANN;
    converting, by the NVM crossbar, the analog voltage signals into a correction signal using a plurality of correction cells, each correction cell including one or more NVM elements programmed to a predetermined conductance level; and
    correcting each MAC signal based on the correction signal.

10. The method of claim 9, where:
    the NVM crossbar includes a plurality of row signal lines coupled to the DACs, a plurality of MAC column signal lines, and a correction column signal line;
    a MAC cell is disposed at each intersection of a row signal line and a MAC column signal line;
    a correction cell is disposed at each intersection of a row signal line and the correction column signal line;
    said converting the analog voltage signals into a plurality of MAC signals includes generating, by each MAC column signal line, a MAC signal based on the analog voltage signals and the respective MAC cells; and
    said converting the analog voltage signals into a correction signal includes generating, by the correction column signal line, the correction signal based on the analog voltage signals and the correction cells.

11. The method of claim 10, where:
    each ADC is coupled to a respective MAC column signal line and configured to receive a respective MAC signal;

each ADC is coupled to the correction column signal line and configured to receive the correction signal; and said correcting each MAC signal includes correcting, by each ADC, the respective MAC signal prior to digitizing the respective MAC signal.

12. The method of claim 11, where:

each ADC includes an adjustable reference voltage level; and said correcting each MAC signal includes correcting, by each ADC, the respective MAC signal by adjusting the adjustable reference voltage level based on the correction signal.

13. The method of claim 10, where:

the NVM crossbar module includes a plurality of subtraction blocks;

each subtraction block is coupled to a respective MAC column signal line and configured to receive a respective MAC signal;

each subtraction block is coupled to the correction column signal line and configured to receive the correction signal;

each subtraction block is coupled to a respective ADC;

said correcting each MAC signal includes subtracting, by each subtraction block, the correction signal from the respective MAC signal; and each subtraction block is configured to output the corrected MAC signal to the respective ADC.

14. The method of claim 9, where the conductance levels are discrete and range from a first conductance level, $g_{off}$, to a last conductance level, $g_{on}$.

15. The method of claim 14, where $g_{off}$ is associated with an NVM element high-resistance state, and $g_{on}$ is associated with an NVM element low-resistance state.

16. The method of claim 15, where the predetermined conductance level is the first conductance level, $g_{off}$.

17. The method of claim 9, where the predetermined conductance level represents a correction weight determined during training of the ANN.

18. A non-volatile memory (NVM) crossbar, comprising:

a plurality of row signal lines configured to receive input analog voltage signals;

a plurality of multiply-and-accumulate (MAC) column signal lines;

a correction column signal line;

a MAC cell disposed at each intersection of a row signal line and a MAC column signal line; and a correction cell disposed at each intersection of a row signal line and the correction column signal line, where each MAC cell includes one or more NVM elements programmed to a conductance level representing one of a plurality of unipolar weights of an ANN, and each correction cell includes one or more NVM elements programmed to a predetermined conductance level, where each MAC column signal line is configured to generate a MAC signal based on the input analog voltage signals and the respective MAC cells, and the correction column signal line is configured to generate a correction signal based on the input analog voltage signals and the correction cells, and where each MAC signal is corrected based on the correction signal.

19. The NVM crossbar of claim 18, where:

the conductance levels are discrete and range from a first conductance level, $g_{off}$, to a last conductance level, $g_{on}$;

$g_{off}$ is associated with an NVM element high-resistance state; and $g_{on}$ is associated with an NVM element low-resistance state.

20. The NVM crossbar of claim 19, where:

the predetermined conductance level is the first conductance level, $g_{off}$; or the predetermined conductance level represents a correction weight determined during training of the ANN.

* * * * *